(12) United States Patent
Miwa et al.

(10) Patent No.: US 12,230,335 B2
(45) Date of Patent: Feb. 18, 2025

(54) DATA LATCH PROGRAMMING ALGORITHM FOR MULTI-BIT-PER-CELL MEMORY DEVICES

(71) Applicant: SanDisk Technologies LLC, Addison, TX (US)

(72) Inventors: Toru Miwa, Yokohama (JP); Fumiaki Toyama, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 11 days.

(21) Appl. No.: 17/838,717

(22) Filed: Jun. 13, 2022

(65) Prior Publication Data

US 2023/0402113 A1 Dec. 14, 2023

(51) Int. Cl.
| | |
|---|---|
| G11C 16/34 | (2006.01) |
| G11C 7/10 | (2006.01) |
| G11C 16/10 | (2006.01) |
| G11C 16/26 | (2006.01) |

(52) U.S. Cl.
CPC ........ G11C 16/3459 (2013.01); G11C 7/1039 (2013.01); G11C 16/102 (2013.01); G11C 16/26 (2013.01); G11C 16/3404 (2013.01)

(58) Field of Classification Search
CPC ............................ G11C 16/3459; G11C 16/34
USPC ...................................... 365/185.03
See application file for complete search history.

(56) References Cited

U.S. PATENT DOCUMENTS

| | | | | |
|---|---|---|---|---|
| 2008/0137416 A1* | 6/2008 | Lee | ......................... | G11C 16/10 365/185.12 |
| 2008/0158951 A1* | 7/2008 | Aritome | ............. | G11C 16/3431 365/185.03 |
| 2013/0033938 A1* | 2/2013 | Park | .................... | G11C 16/0483 365/185.22 |
| 2015/0193302 A1* | 7/2015 | Hyun | .................... | G11C 29/028 714/764 |
| 2016/0125922 A1* | 5/2016 | Chen | ...................... | G11C 16/10 365/189.16 |
| 2021/0391012 A1* | 12/2021 | Masuduzzaman | .......................... | G11C 16/3427 |
| 2023/0032133 A1* | 2/2023 | Park | .................... | G11C 16/3427 |
| 2023/0091314 A1* | 3/2023 | Wang | ..................... | G11C 16/08 365/189.011 |

* cited by examiner

Primary Examiner — Muna A Techane
(74) Attorney, Agent, or Firm — Mullin Sheppard; Richter & Hampton LLP

(57) ABSTRACT

A multi-stage method for programming an n-bit memory cell array using a fixed number of data latches is disclosed. The fixed number of data latches may be a reduced number of data latches in sense amplifier and data latch (SADL) peripheral circuitry than is required by existing programming techniques. As such, the die area taken up by the SADL circuitry can be reduced, which in turn, reduces overall chip area. The multi-stage programming method may include utilizing a first data latch to receive and store program page data and utilizing a second data latch to store bit information indicating which cells are to be targeted for the multi-stage programming. At each program stage, a respective program loop may be performed with respect to each threshold voltage distribution generated during a prior program stage to create two new threshold voltage distributions from the prior distribution.

12 Claims, 20 Drawing Sheets

700A

| Data Latch | Usage |
|---|---|
| DL0 | Program data (lower page) |
| DL1 | Program data (middle page) |
| DL2 | Program data (upper page) |
| DL3 | Program data (top page) |

| State | Erase | A | B | C | D | E | F | G |
|---|---|---|---|---|---|---|---|---|
| DL0 | 1 | 0 | 1 | 0 | 1 | 0 | 1 | 0 |
| DL1 | 1 | 1 | 0 | 0 | 1 | 1 | 0 | 0 |
| DL2 | 1 | 1 | 1 | 1 | 0 | 0 | 0 | 0 |
| Lower | 1 | 0 | 0 | 1 | 1 | 0 | 0 | 1 |
| Middle | 1 | 1 | 0 | 0 | 0 | 0 | 1 | 1 |
| Upper | 1 | 1 | 1 | 1 | 0 | 0 | 0 | 0 |

FIG. 7C

DATA LATCH PROGRAMMING ALGORITHM FOR MULTI-BIT-PER-CELL MEMORY DEVICES

BACKGROUND

Flash memory is an electronic, non-volatile computer memory storage medium that can be electrically erased and reprogrammed. Flash memory is widely used across a range of products and industries including computers, mobile phones, tablet devices, personal digital assistants (PDAs), digital audio players, digital cameras, video games, scientific instrumentation, industrial robotics, and medical electronics, to name a few. NAND flash memory—one of the two primary types of flash memory—can be found in memory cards, USB flash drives, solid-state drives, smartphones, and the like. NAND flash may employ floating gate transistors (e.g., floating gate metal-oxide-semiconductor field-effect transistors (MOSFETs)) or charge trapping layer (CTL) transistors, connected in a manner that resembles a NAND logic gate.

Various types of NAND flash technology are available that differ in the number of programmed states that can be achieved for a NAND flash cell, and thus, the number of bits of information that can be stored in a single cell. In single-level cell (SLC) NAND flash technology, for instance, each memory cell stores 1 bit of information by virtue of being in one of two possible states—an erase state or a programmed state. In multi-level cell (MLC) NAND flash technology, each memory cell stores 2 bits of information, which corresponds to three programmed states and one erase state. Along similar lines, in triple-level cell (TLC) flash technology, each flash memory cell stores three bits of information, which in turn, corresponds to seven programmed states and one erase state, and so on for higher-cell flash technologies, and in quad-level cell (QLC) flash technology, each cell stores four bits of information, which corresponds to fifteen programmed states and one erase state.

A NAND flash memory cell is set (programmed) and reset (erased) by applying or removing charge from a floating gate (FG) or charge trapping layer (CTL) of the cell. Fowler-Nordheim (FN) tunneling or hot carrier injection (HCI) techniques may be employed to apply or remove charge. When charge is applied to or removed from a FG transistor or CTL transistor of a flash memory cell, the threshold voltage of the transistor changes. This change in threshold voltage is what allows the flash memory cell to be used as a memory storage device. That is, information is stored in the flash memory cell as the threshold voltage of the underlying transistor of the cell.

Data latches may be used to store program data to be written to the flash cells. To program a flash memory cell, a set of programming pulses may be applied to cause the threshold voltage of a cell's transistor to change to one of the possible threshold voltage values that the transistor can attain, and thus, to place the cell in one of the possible programmable states that corresponds to the latched program data for that cell. The number of programming pulses needed may depend on whether the cell is a single-bit cell of a multi-bit cell.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 7C depicts translation of program data entered into the data latches to a binary encoded destination mapping as part of a preparation phase of the programming method of FIG. 6.

Figure 1:
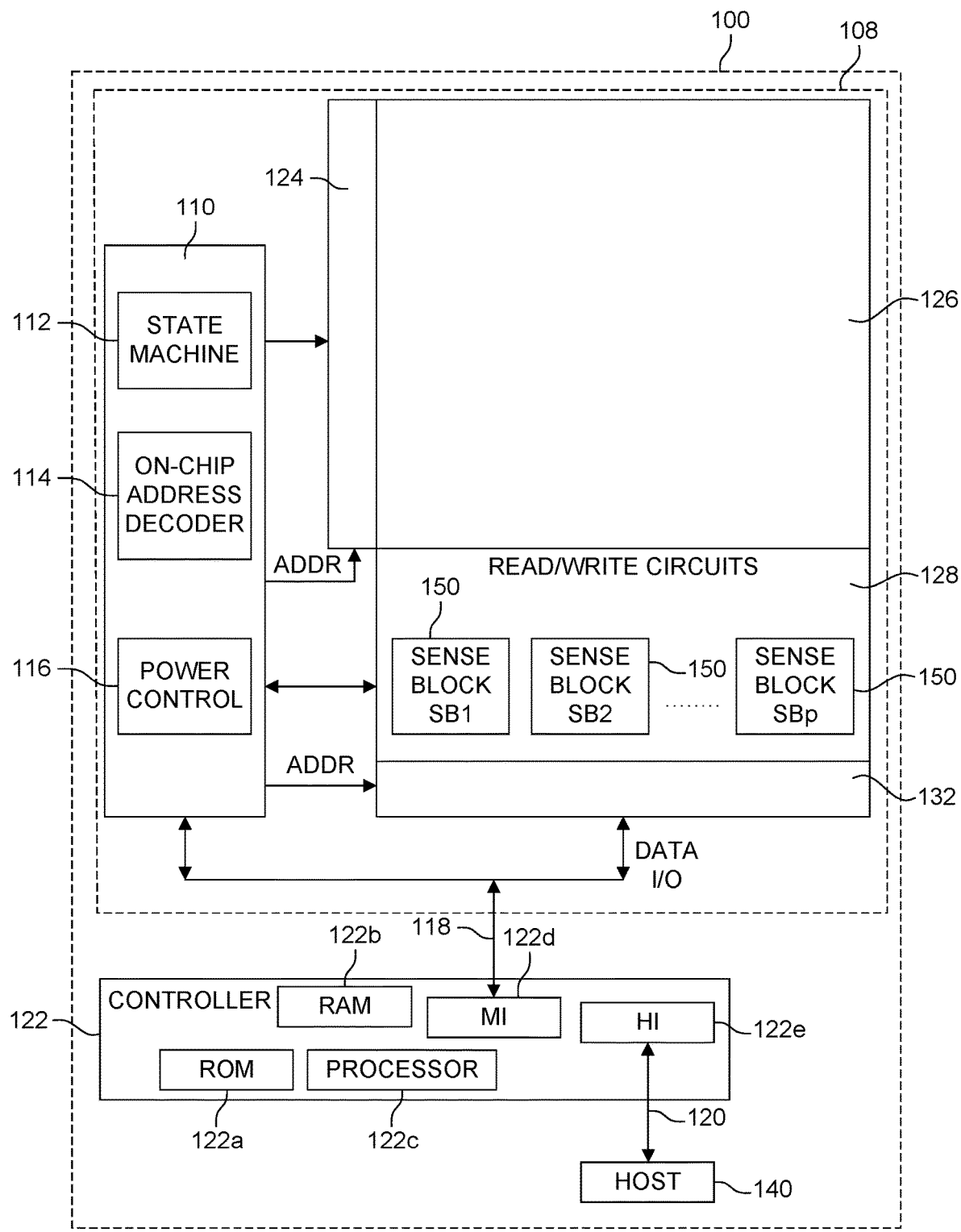
FIG. 1 is a block diagram of an example memory device, in connection with which, example embodiments of the disclosed technology can be implemented.

The figures are not exhaustive and do not limit the present disclosure to the precise form disclosed.

DETAILED DESCRIPTION

Three-dimensional (3D) NAND flash memory technology is progressing at a rate that is outpacing even the growing market demand for higher memory density. However, as the die area occupied by the cell array in flash memory continues to decrease with each new product generation, a simultaneous push to reduce the area of peripheral circuitry is occurring, due to the peripheral circuitry area now being more of a limiting factor in reducing total chip size than the cell array area. This push has been accelerated by the recent transition from a complementary metal-oxide-semiconductor (CMOS) next to array (CNA) 3D NAND architecture to a CMOS under array (CUA) architecture. In particular, due to the overlap between the cell array and peripheral circuitry (e.g., sense amplifier, data latches, etc.) in the CUA architecture, reductions in the cell array area no longer impact total chip area. As such, reducing the size of peripheral circuitry has now come even more into focus as a vehicle for reducing total chip area.

In an example implementation, QLC NAND flash memory—in which each cell stores 4 bits of information—may include a sense amplifier and six data latches for each bitline. The data latches may include, for example, one sense data latch (SDL), one temporal data latch (TDL), and four data latches for storing the program data. The combination of the sense amplifier and the data latches may be referred to as SADL. The SADL provided for each bitline is considered to be part of the peripheral circuitry of a NAND device for the purposes of this disclosure. In some embodiments, the peripheral circuitry may also include other components such as charge pumps, a controller, etc. As noted above, a reduction in the size of the peripheral circuitry, and in particular, the size of the SADL for each bitline can result in a reduction in total chip size. For instance, in an example implementation, if the SADLs occupy 50% of the total chip area, a reduction in SADL area by X % would result in a total chip area reduction of (X/2)%. Reducing total chip area is desirable because it can produce significant cost savings during the fabrication process.

In addition to the contributing factors noted above, a trend towards increased logical scaling is leading to an increase in the size of the peripheral circuitry (in particular the SADL circuitry), thus making the peripheral circuitry even more of a hindrance to reducing overall chip area. More specifically, the transition from 3 bits of stored information per cell (i.e., TLC technology) to 4 bits of stored information per cell (i.e., QLC technology) and beyond is making the cell area even smaller, but at the same time, is causing an increase in the size of the SADL since existing programming algorithms require $\log_2$ (# of cell states) of data latches for each bitline. For example, for a QLC memory cell that stores 4 bits of information, there are 16 states (an erase state and 15 programmed states), and thus, existing programming algorithms would require $\log_2 16=4$ data latches for each bitline. As the number of bits of information a cell can store increases, so too does the number of possible states for the cell, and thus, the number of data latches that conventional programming algorithms would need per bitline in order to program the cells.

Embodiments of the disclosed technology relate to novel methods, algorithms, and techniques for programming an n-bit cell distribution for a memory cell array in a manner that utilizes a reduced and fixed number of data latches as compared to existing programming techniques. Embodiments of the disclosed technology also relate to circuits, memory devices, and controllers configured to implement such methods, algorithms, and techniques. By virtue of employing a reduced number of data latches for programming a memory cell array such as a NAND flash memory cell array, the technology disclosed herein allows for the number of data latches provided as part of the SADL for each bitline to be reduced, thereby decreasing the footprint of the SADL peripheral circuitry, and concomitantly, reducing the total chip area. Thus, embodiments of the disclosed technology provide a technical solution to the technical problem of the size of the peripheral circuitry in memory devices such as NAND flash memory being a limiting factor to achieving further reductions in total chip area.

According to example embodiments, a multi-stage programming algorithm is disclosed that is capable of programming a multi-bit-per-cell memory array using a fixed number of data latches in the SADL per bitline, regardless of the number of bits of information each cell can store. In example embodiments, this fixed number of data latches is 2 in each SADL. This allows for a reduction in the amount of die area taken up by the SADL peripheral circuitry and provides the technical effect of reduced die fabrication costs (e.g., a greater production yield for a given fabrication cost).

In an example embodiment, a multi-stage programming method for programming an erased block of NAND flash memory, for example, includes receiving lower page program data into a first data latch. Throughout this disclosure, when describing this embodiment, a first data latch may refer to a data latch of an SADL that receives and stores program data and a second data latch may refer to a data latch that stores data associated with an internal data load (IDL) detecting cells that are in a threshold voltage distribution generated in a prior stage of the multi-stage programming. It should be appreciated, however, that the labels "first," "second," "third," etc. applied when describing data latches may vary from one embodiment to the next depending on the particular functions performed by the data latches in that embodiment. Moreover, in some cases, the symbols used in this disclosure and/or in the Figures to represent data latches may not coincide with the labels (e.g., first, second, etc.) applied herein when describing the data latches. For instance, in the above-introduced embodiment, a first data latch refers to data latch DL1 depicted in FIG. 10, and the second data latch refers to data latch DL2 depicted in FIG. 10.

Continuing with a description of the multi-stage programming method of this embodiment, the lower page program data may be program data entered by a user. In connection with receipt of the lower page program data, an initial program stage may be performed during which two threshold voltage distributions may be generated based on the lower page program data. These two threshold voltage distributions may include a first distribution representing a lower page bit value of 1 (e.g., an erase state) and a second distribution representing a lower page bit value of 0 (e.g., a programmed state). In an example embodiment, generating these threshold voltage distributions includes performing a program operation on a memory cell to shift its threshold voltage to a value corresponding to the bit value of 0 (e.g., a value in the second threshold voltage distribution mentioned above) or maintaining a cell in the erase state (e.g., a threshold voltage value in the first threshold voltage distribution). Whether a cell is programmed or maintained in the erase state may depend on the lower page program data being received and latched at the first data latch. In an example embodiment, programming a cell includes applying one or more pulses of a programming voltage to the cell, followed by one or more pulses of a program verify voltage until it is determined that the cell's threshold voltage has reached the target state.

In an example embodiment, data may be stored in a second data latch (e.g., DL0), indicating which cells are in a threshold voltage distribution generated in a prior stage of the multi-stage programming method. More specifically, DL0 may store data in connection with an IDL, where a stored bit 0 indicates a cell to be programmed using a multi-stage method disclosed herein, and where a stored bit 1 indicates a cell that has passed program-verify and/or is not a target of the multi-state programming method. As used herein, an IDL may refer to any type of read operation to reach some data from interim threshold voltage (Vt) distributions. For example, at a beginning of a middle page program, IDL data may be stored in DL1 (e.g., DL1 may be set to 0 indicating cells to be programed). To set DL1 to 0, during a first loop a memory system reads at a page that was programmed before the middle page. During a second loop, 0 is erased from cells after the lower page program, which can be achieved by flipping data in DL1 which keeps data for the first loop, or repeat the IDL but with flipped 0 to 1 assignment. In another example, data may be kept in DL1 and a following logical operations in SADL may be adjusted.

In an example embodiment, the next level of page data may be received at the first data latch (e.g., DL1). For example, middle page program data may be received at DL1. A next program stage may then be initiated. This next program stage may include performing a program loop with respect to each threshold voltage distribution generated during the immediately prior program stage. Each program loop may split a particular threshold voltage distribution generated during the preceding program stage into two new threshold voltage distributions. Prior to initiating each program loop, an IDL may be done from memory cells to distinguish the memory cells that are in the currently addressed threshold voltage distribution from those that are not. The information from the IDL can be stored in the second data latch (e.g., DL0). If the second data latch holds 0, it means the associated memory cell is currently addressed, and if first data latch holds 1, it means its associated memory cell is not addressed. Each threshold voltage distribution generated during the prior program stage may be iterated through, and the above-described program loop may be performed for each such threshold voltage distribution.

In an example embodiment, performing each program loop may include programming each cell that having a threshold voltage that falls within the addressed threshold voltage distribution for that program loop to an appropriate state, e.g., an appropriate new threshold voltage that is based on the middle page program data received and stored in DL1. In an example embodiment, after a program loop has been completed for a given addressed threshold voltage distribution, those cells that have passed the program-verify operation may have corresponding bit values in DL0 set to 1 to indicate that those cells have been successfully programmed. By setting DL0 to 1, the associated cells can be inhibited from the succeeding program pulses in the loop, as the cells can be handled similar to other cells that are not addressed in the program loop. Moreover, any cells that are not within the currently addressed threshold voltage distribution may have their corresponding bit values in DL0 set to 1 to indicate that they are not a target of the current program loop.

After all threshold voltage distributions generated from the initial program stage have been iterated through and a respective program loop has been performed with respect to each such distribution, the second program stage is complete. If the memory cell array is an MLC array in which each cell stores 2 bits of information, the multi-stage programming method is complete. On the other hand, if each cell stores more than 2 bits of information, an additional program stage may be performed with respect to each additional bit of information that a cell can store. For instance, if the cell array is a QLC array, two additional program stages may be performed for a total of 4 program stages. At the completion of the fourth program stage, 16 threshold voltage distributions may have been generated.

Using a TLC flash memory cell array as an example, after the second program stage corresponding to the middle page program data is completed and the data in DL0 has been updated to reflect the programming results of the program loops performed during the second program stage, upper page program data may be received and stored in DL1. Then, a third program stage may be initiated during which a program loop is performed with respect to each of the four threshold voltage distributions generated during the second program stage. Each program loop results in one of the four threshold voltage distributions being split into two new threshold voltage distributions. Thus, the third program stage ultimately results in 8 threshold voltage distributions corresponding to the 8 possible states of a TLC flash cell. The multi-stage programming method according to this embodiment may continue, as described, until all the information is written (e.g., 2 bits for MLC, 3 bits for TLC, 4 bits for QLC, and so on).

A technical benefit of the above-described multi-stage programming method is that only two data latches are needed to program a memory cell array using the method, regardless of the number of bits of information to be programmed into a cell. That is, in example embodiments, a multi-stage programming method is capable of programming 2-bit cells, 3-bit cells, 4-bit cells, and so on using only two data latches—one to hold the program data for a current page level being programmed and the other to distinguish cells that are in the addressed threshold voltage distribution from those that are not. Thus, using the multi-stage programming method according to example embodiments of the disclosed technology, a number of data latches in each SADL that are typically used for program operations can be reduced from 4 to 2, for example. The overall chip area can then be reduced based on this reduction in the SADL size.

Variations of the above-described multi-stage programming method are also within the scope of the disclosed technology. For instance, as will be described in more detail later in this disclosure in reference to the various Figures, in some embodiments, more than two data latches may be employed (e.g., 3 data latches) to provide other technical benefits/effects such as to reduce the number of program stages that are needed and/or to improve program throughput. In such embodiments, a lesser reduction in the size of the SADL peripheral circuitry may be chosen as a trade-off for achieving these other technical benefits.

FIGS. 1 to 4G depict an example memory system that can be used to implement the technology disclosed herein. FIG. 1 is a functional block diagram of an example memory system 100. The components depicted in FIG. 1 are electrical circuits. Memory system 100 includes one or more memory dies 108, referred to hereinafter in the singular for ease of explanation. The memory die 108 can be a complete memory die or a partial memory die. In one embodiment, each memory die 108 includes a memory structure 126, control circuitry 110, and read/write circuits 128. Memory structure 126 is addressable by wordlines via a row decoder 124 and by bitlines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the memory die 108. However, in other systems, the controller can be separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters.

The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware). For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The (on-chip or off-chip) controller 122 (which in one embodiment is an electrical circuit) may comprise one or more processors 122c, ROM 122a, random access memory (RAM) 122b, a memory interface (MI) 122d, and a host interface (HI) 122e, all of which may be interconnected. The storage devices (ROM 122a, RAM 122b) store code (software) such as a set of instructions (including firmware), and one or more of the processors 122c are operable to execute the set of instructions to provide functionality described herein. Alternatively or additionally, one or more processors 122c can access code from a storage device in the memory structure, such as a reserved area of memory cells connected to one or more wordlines. RAM 122b can be used to store data for controller 122, including caching program data (discussed below). MI 122d—in communication with ROM 122a, RAM 122b, and processor(s) 122c— may be an electrical circuit that provides an electrical interface between controller 122 and memory die 108. For example, MI 122d can change the format or timing of signals, provide a buffer, isolate from surges, latch I/O, etc. One or more processors 122c can issue commands to control circuitry 110 (or another component of memory die 108) via MI 122d. Host interface 122e provides an electrical interface with host 140 via data bus 120 in order to receive commands, addresses and/or data from host 140 to provide data and/or status to host 140.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 126 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
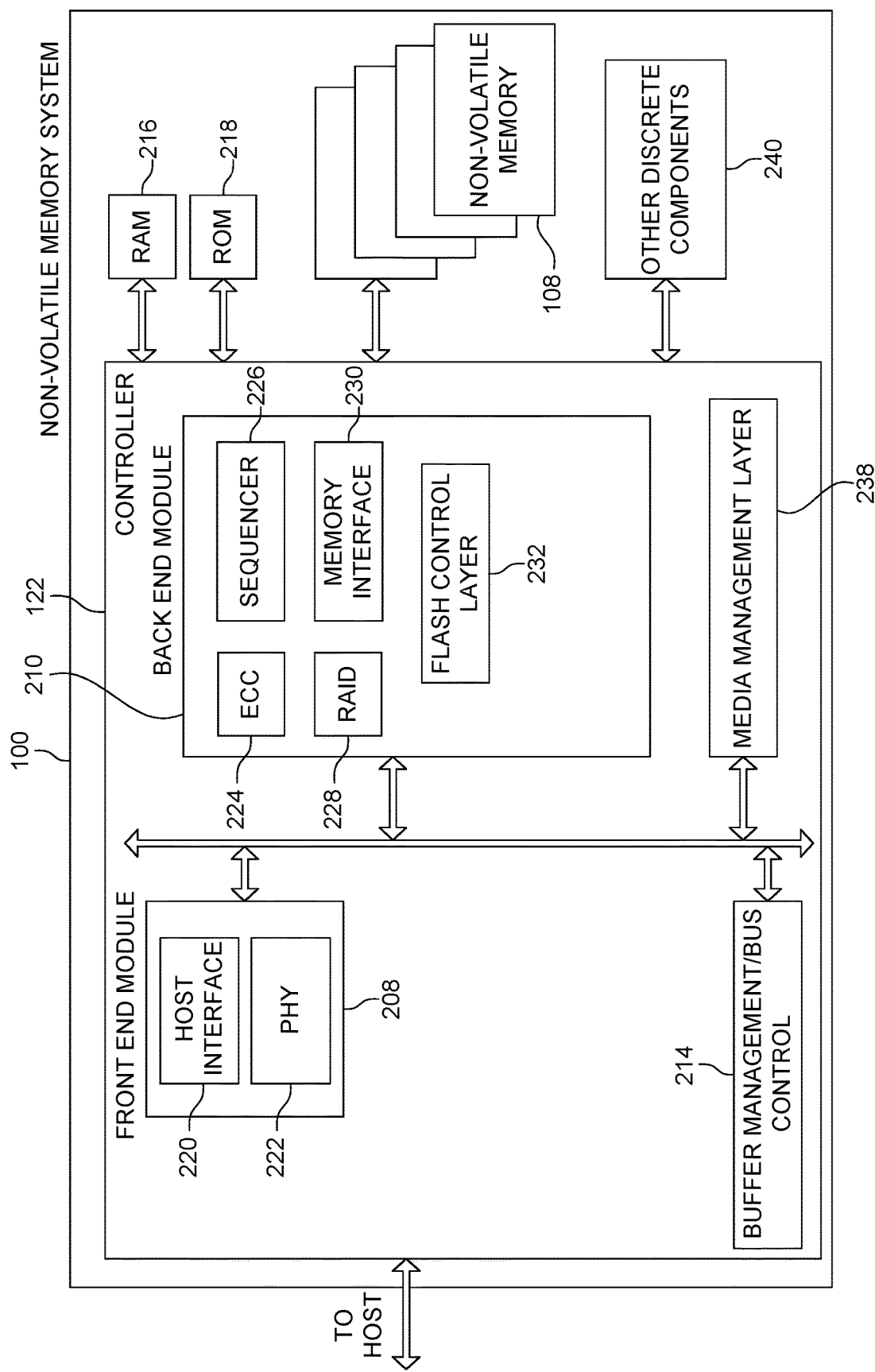
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that non-volatile memory 108 is not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other examples, memory system 100 can be a solid state drive (SSD).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory 108. A command sequencer 226 generates command sequences, such as program and erase command sequences, to be transmitted to non-volatile memory 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory 126 may have limited endurance; 2) the memory 126 may only be written in multiples of pages; and/or 3) the memory 126 may not be written unless it is erased as a block (or a tier within a block in some embodiments). MML 238 understands these potential limitations of the memory 126 which may not be visible to the host. Accordingly, MML 238 attempts to translate the writes from host into writes into the memory 126.

Controller 122 may interface with one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

Figure 3:
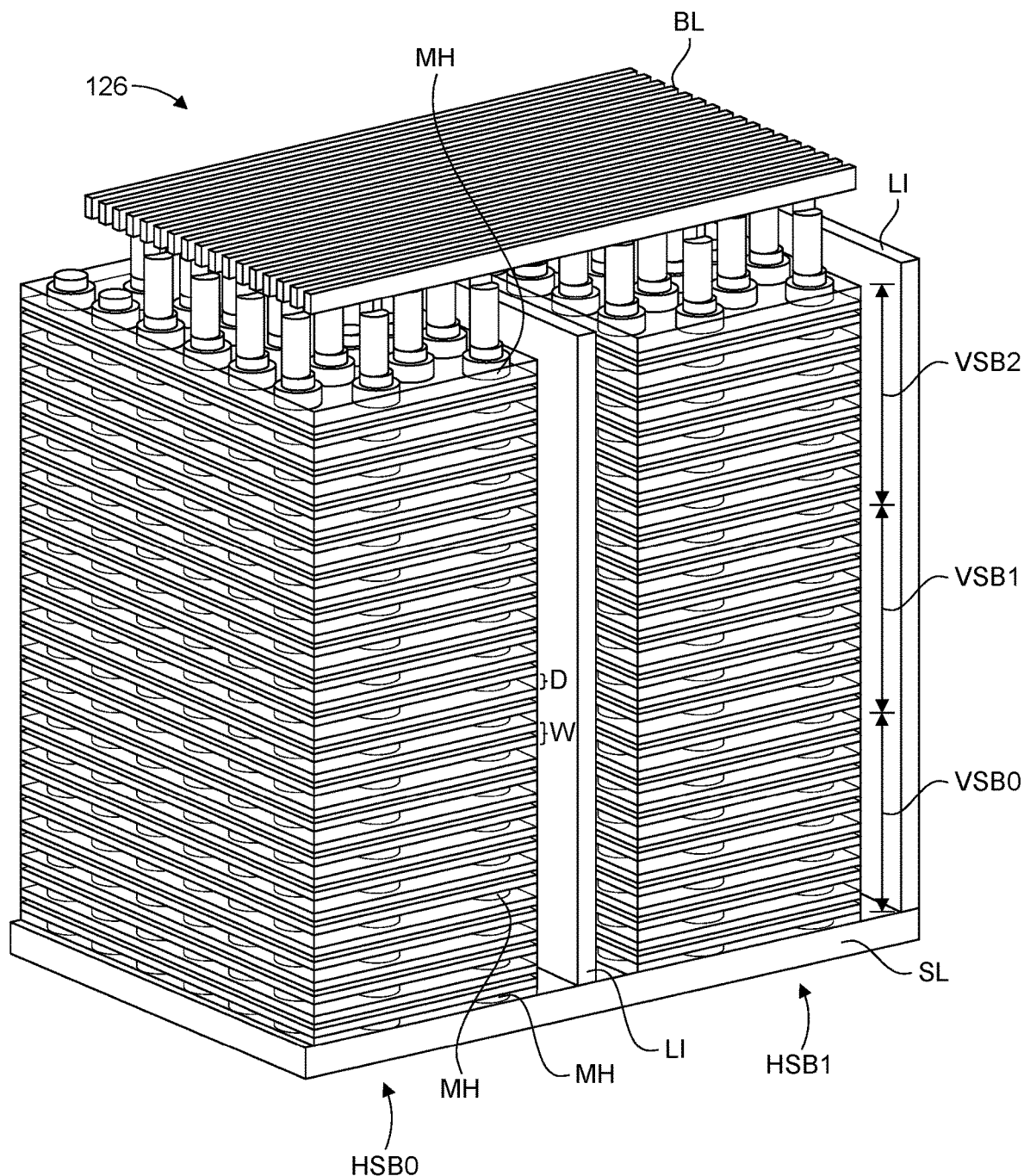
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 126 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
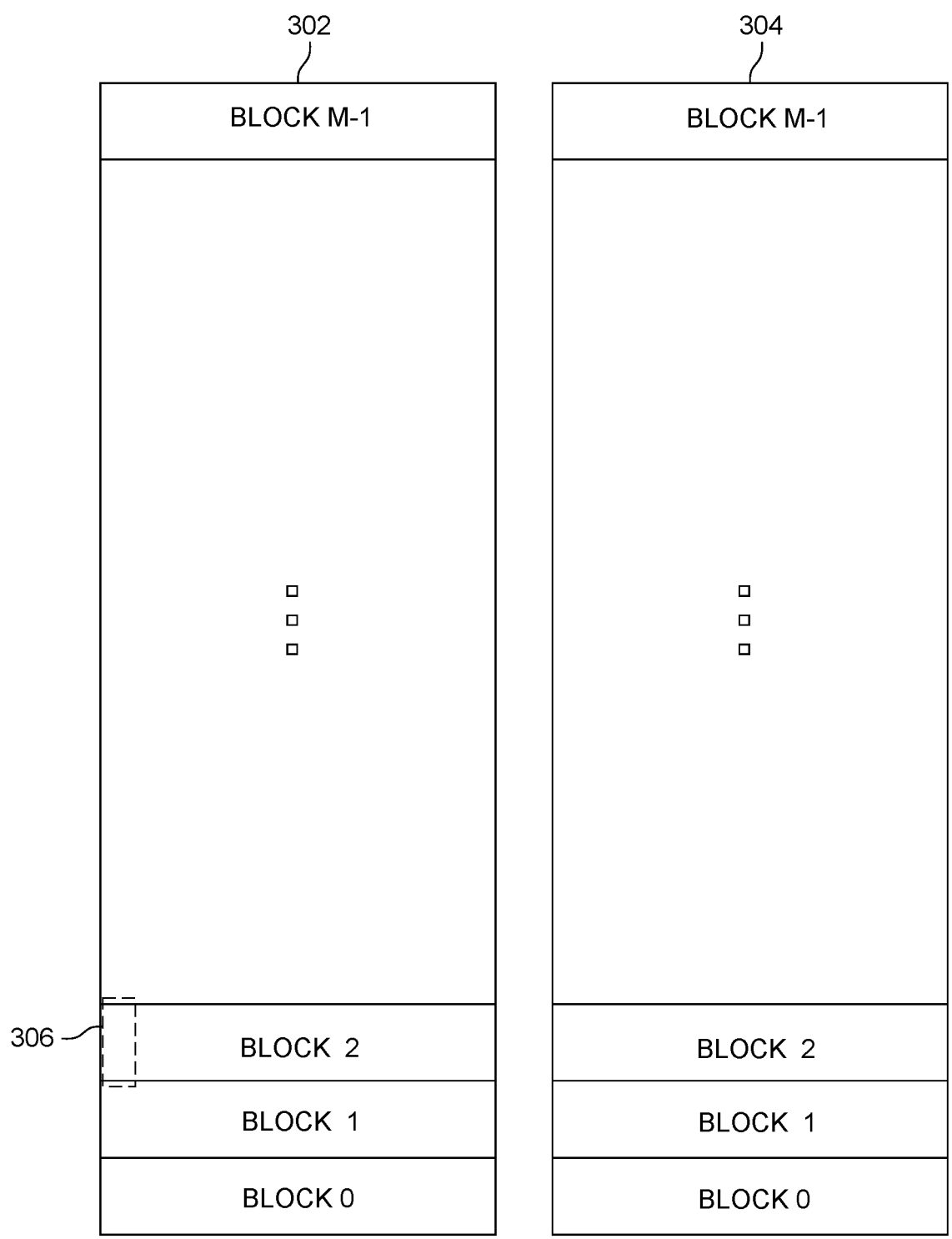
FIG. 4A is a block diagram of an example memory structure having two planes, in connection with which, example embodiments of the disclosed technology can be implemented.

FIG. 4A is a block diagram depicting one example organization of memory structure 126, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 126 to enable the signaling and selection circuits. In some embodiments, a block represents a groups of connected memory cells that share a common set of wordlines.

Figure 4B:
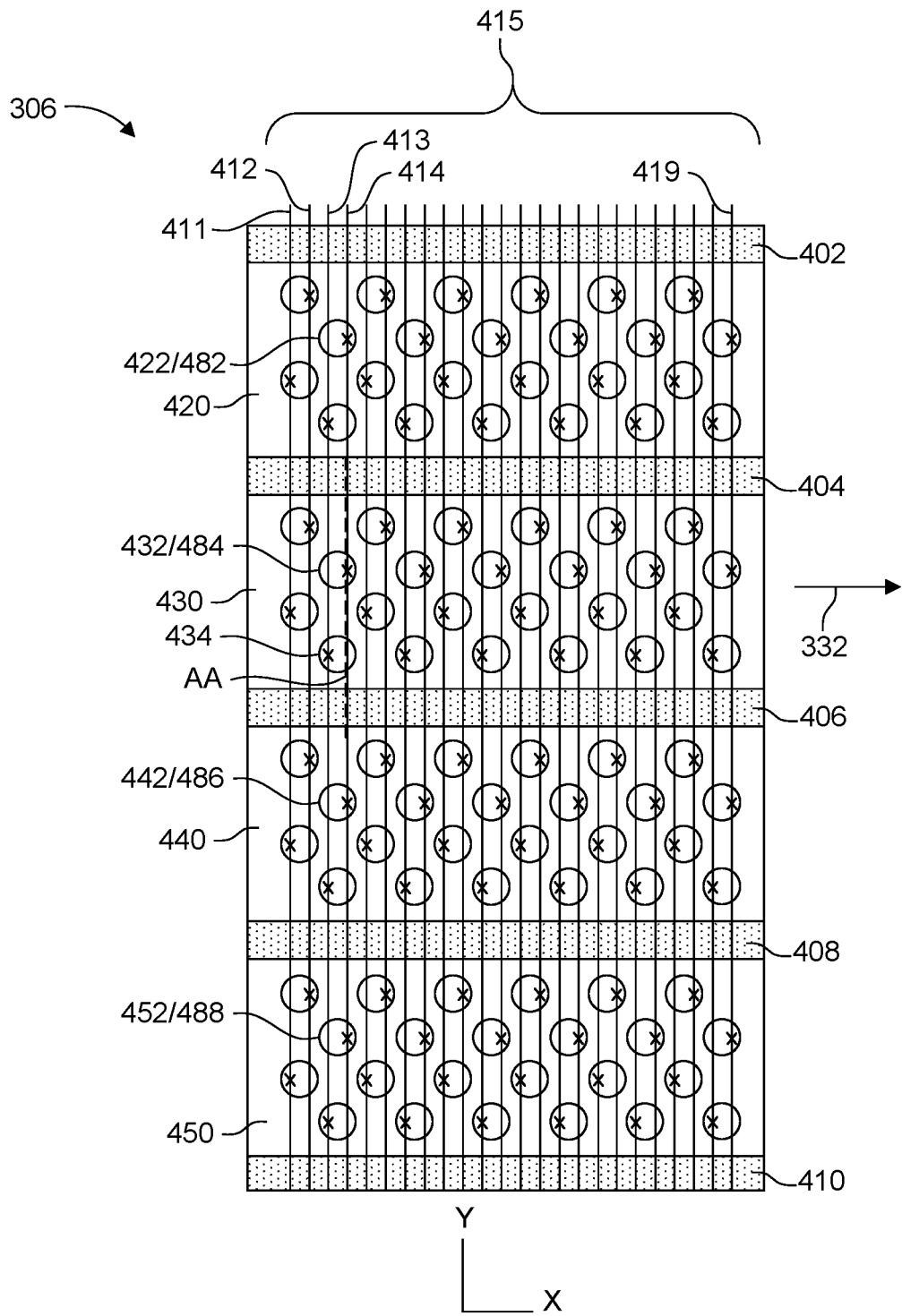
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 126 of FIG. 2. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
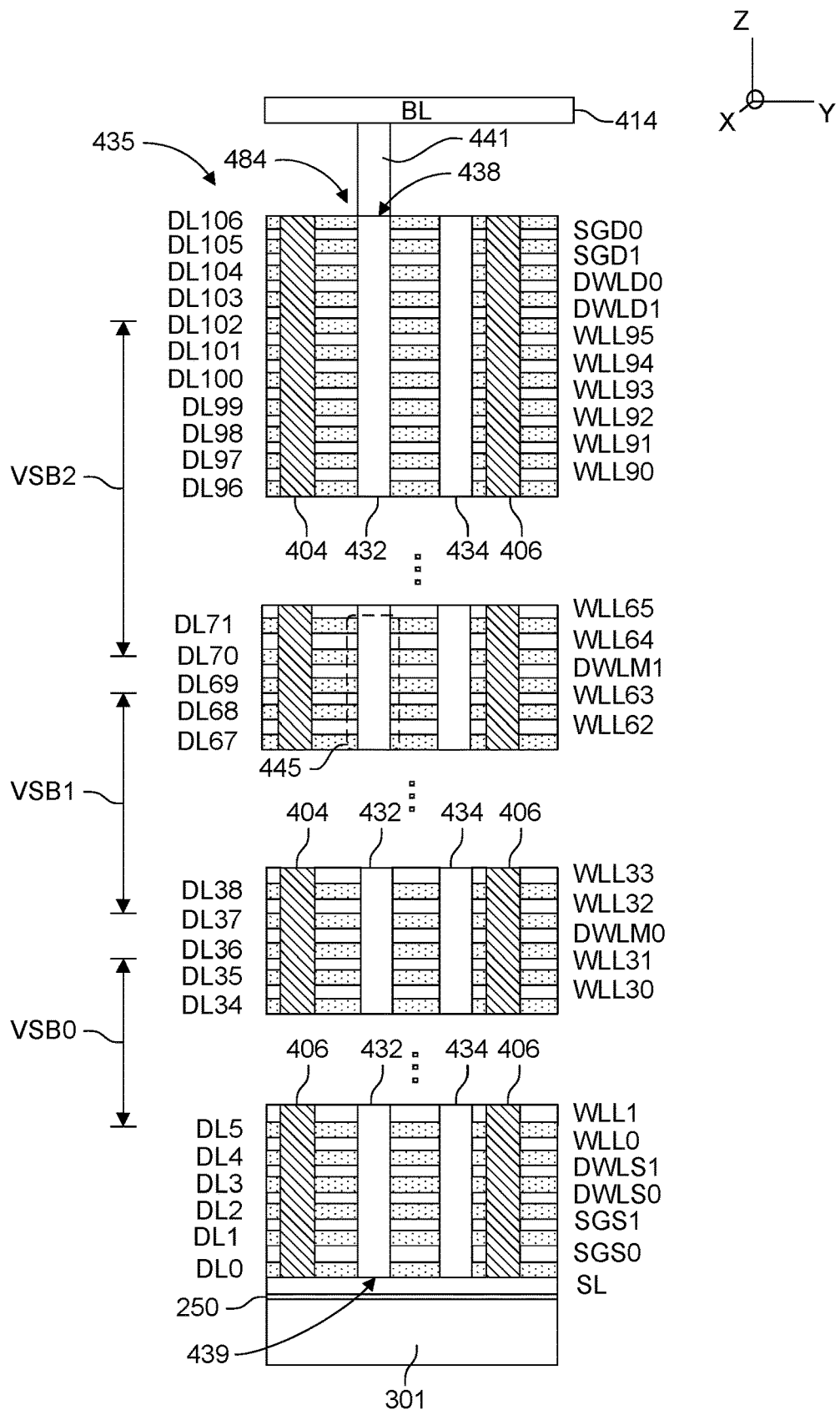
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
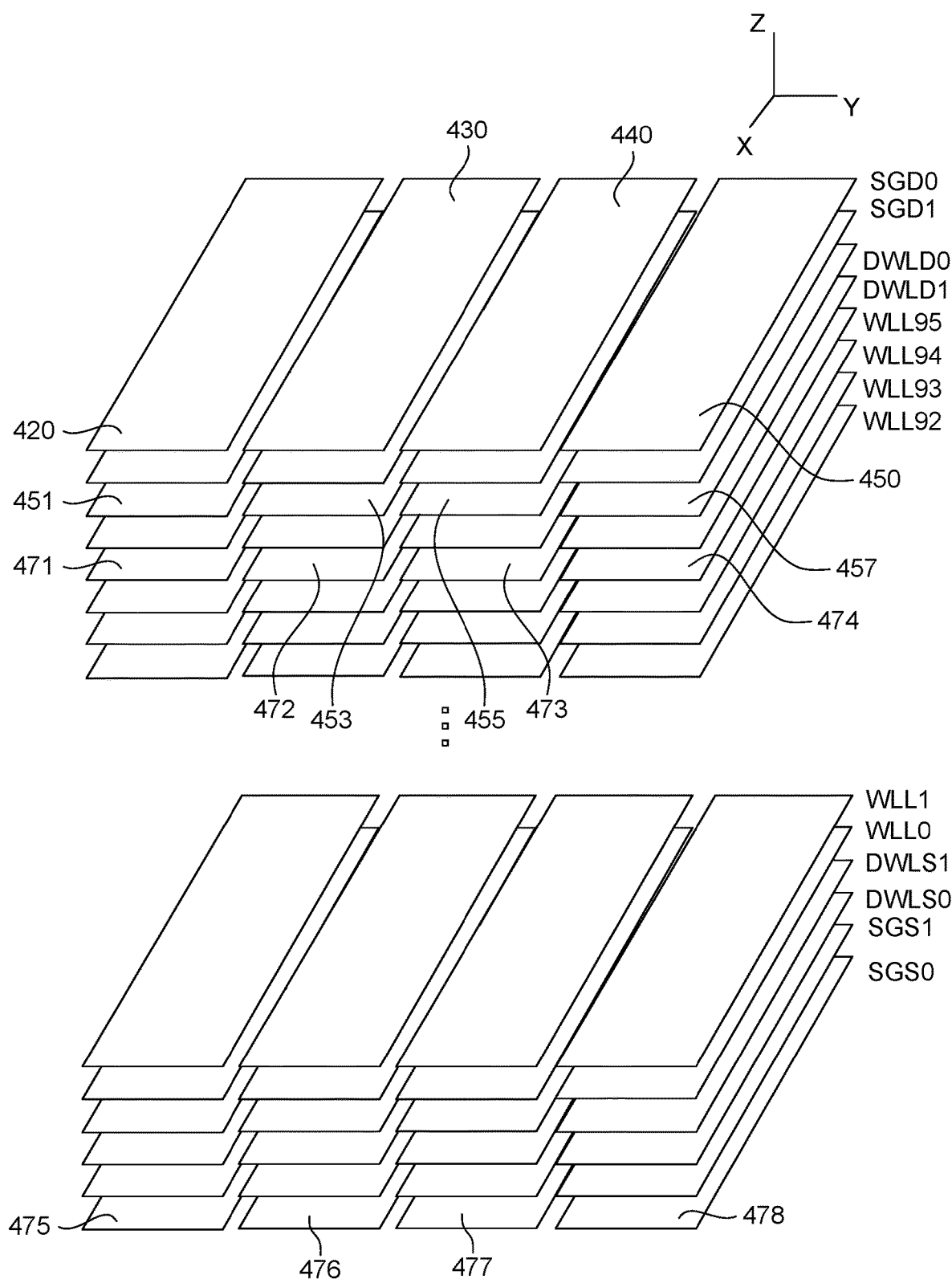
FIG. 4D depicts an alternative view of the select gate layers and wordline layers of the stack 435 of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
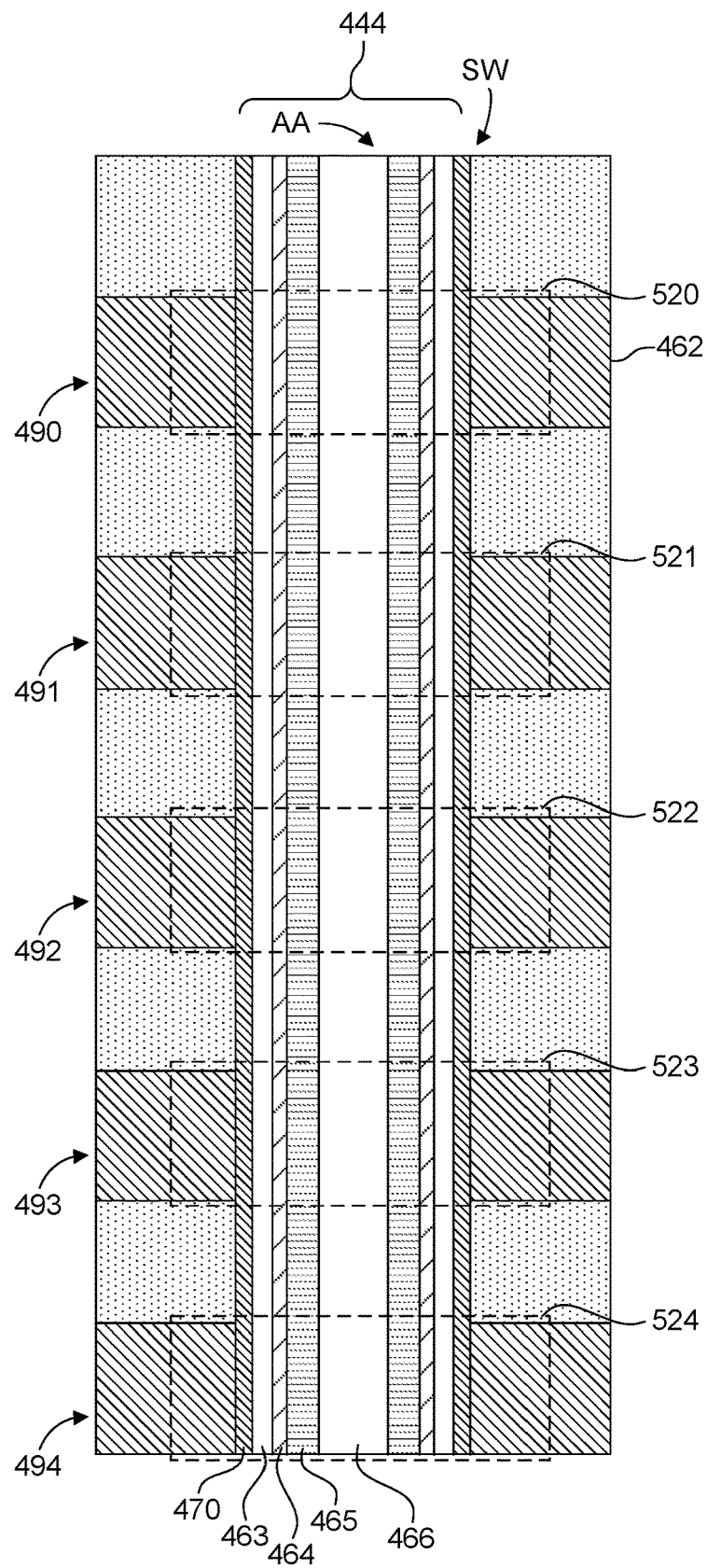
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
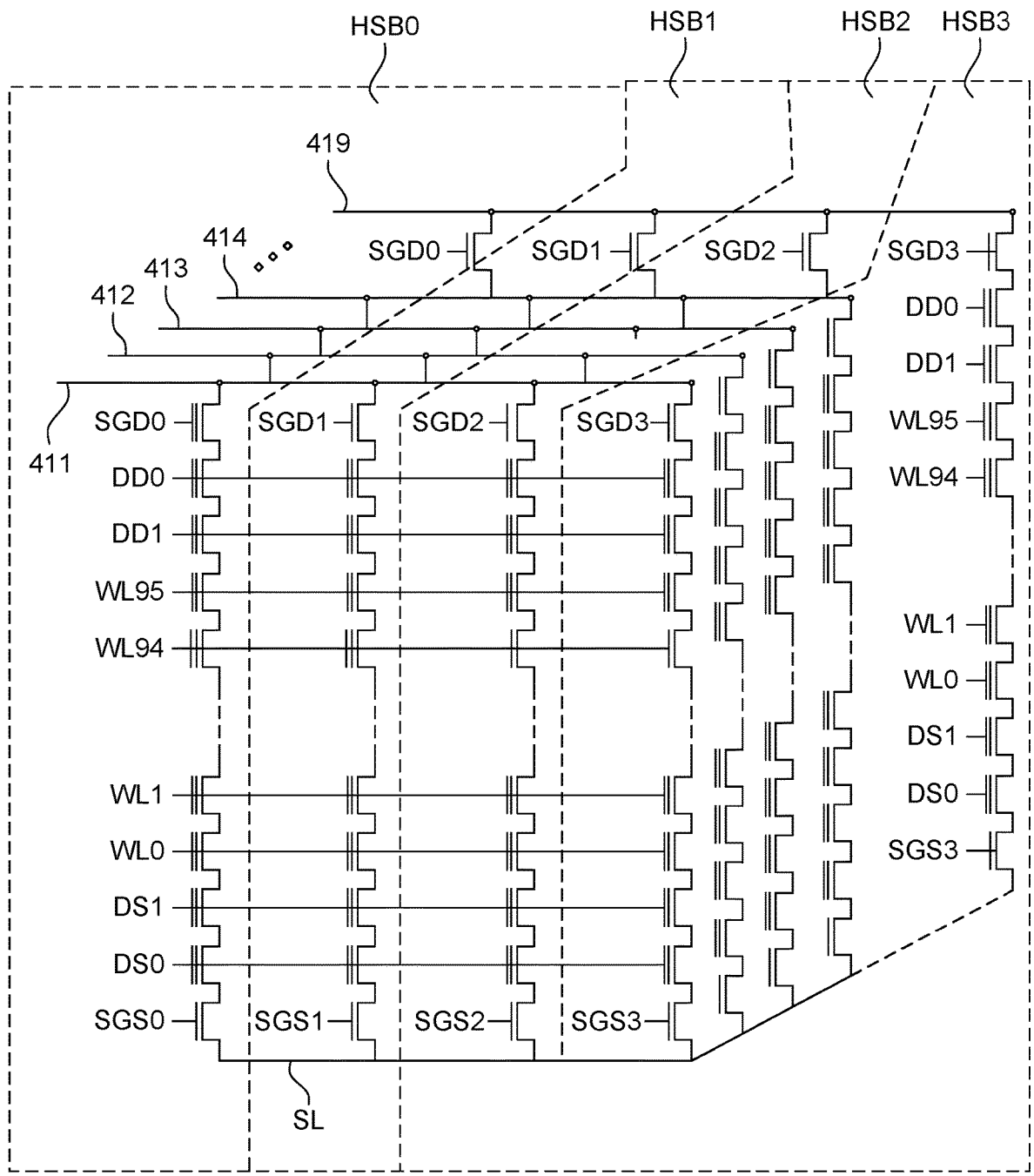
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
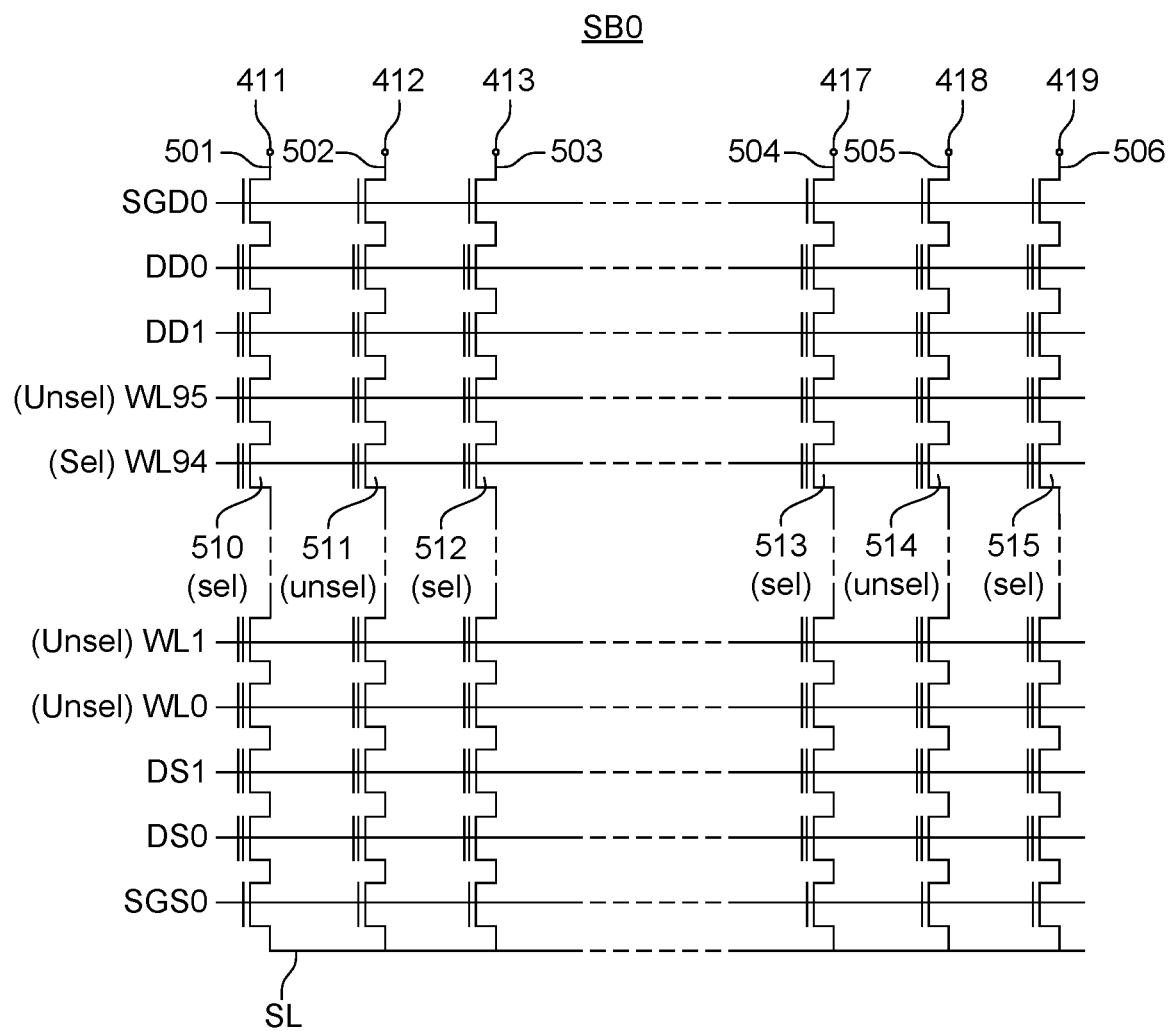
FIG. 4G is a schematic of a plurality of NAND strings showing one example horizontal sub-block, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unset in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

Figure 5:
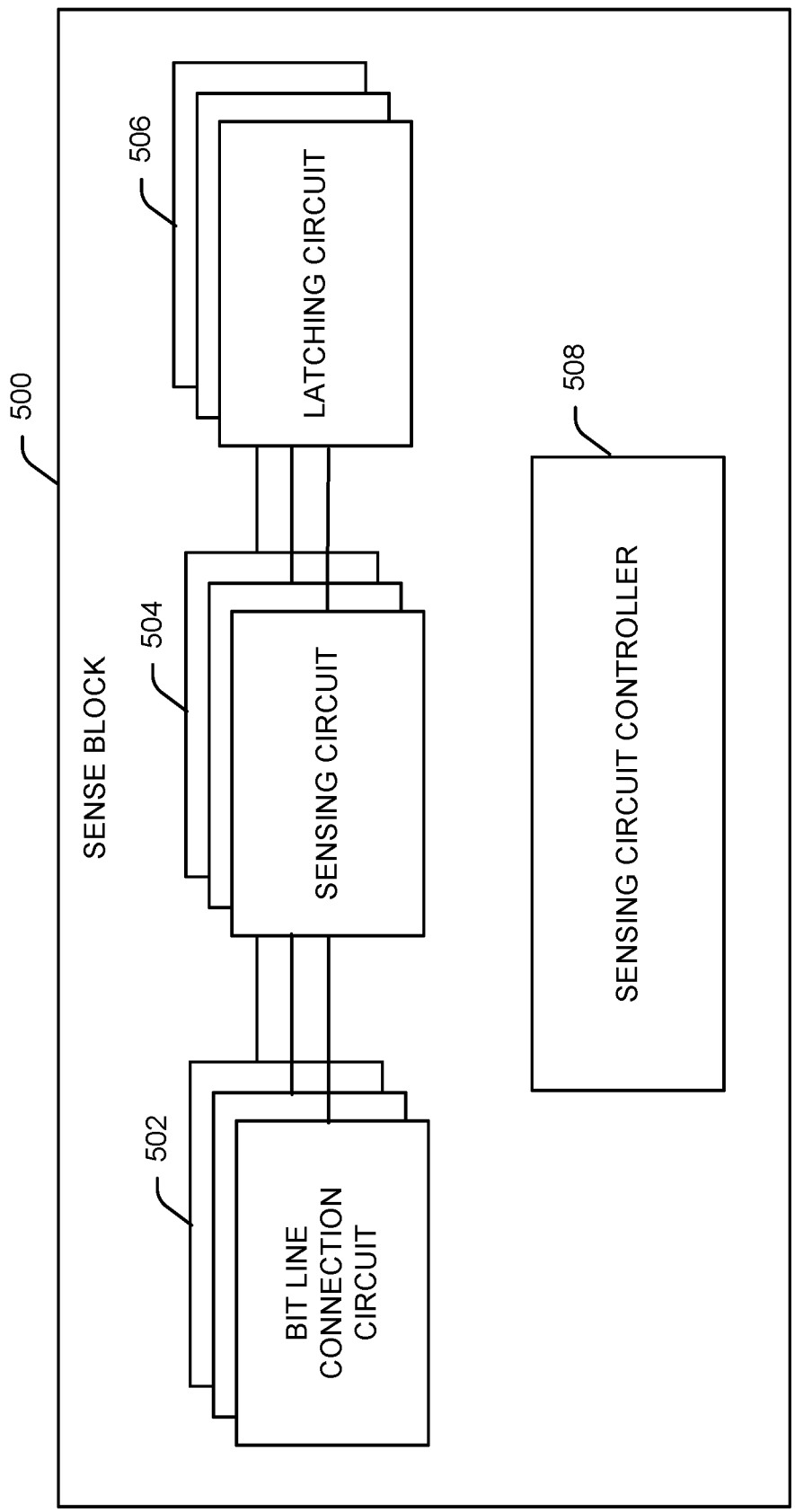
FIG. 5 is a schematic block diagram depicting an example configuration of a sense block of a memory die, in connection with which, example embodiments of the disclosed technology can be implemented.

FIG. 5 is a block diagram of an example configuration of a sense block 500, which may be representative of one of the sense blocks 150 (FIG. 1). The sense block 500 may include a plurality of sense circuits 504 and a plurality of sets of latching circuits 506. For example, there can be 16k sets of sense circuits 504 and latching circuits 506. In other example embodiments, there can be a set of sense circuits 504 and a respective latching circuit 506 for each memory cell in a memory array, for example. In some embodiments, each sense circuit 504 (which may also include sense amplifier circuitry) may be associated with a respective one of the latching circuits 506. That is, each sense circuit 504 may be configured to communicate with and/or perform a sense operation using data and/or storing data into its associated latching circuit 506.

Additionally, the sense block 500 may include a sense circuit controller 508 that is configured to control operation of the sense circuits 504 (and/or the sets of latches 506) of the sense block 500. As described in further detail below, the sense circuit controller 508 may control operation of the sense circuits 504 and the latches 506 by outputting control signals to terminals of the sense circuits 504 and the latches 506. The sense circuit controller 508 may be implemented in hardware, firmware, software, or combinations thereof. For example, the sense circuit controller 508 may include a processor that executes computer instructions stored in a memory to perform at least some of its functions. Controller 508 can be configured with various modules to perform one or more functions. Each module may include one or more instructions for execution of logic of one or more circuits described herein. For example, instructions may include instructions for generating one or more signals or sensing one or more voltage levels. Instructions may further include instructions for executing any of the steps of any of the methods disclosed herein. The controller 508 may send messages and receive data, including program code, through one or more communication interface(s). The received code may be executed by a processor of the controller 508 as it is received, and/or stored in a storage device, or other non-volatile storage for later execution.

Sense circuits 504 described herein can be coupled to bitlines and/or wordlines. Bitline connection circuit 502 is depicted in FIG. 5 as part of sense block 500. It should be appreciated, however, that the bitline connection circuit 502 may be, more generally, part of read/write circuit 128. Bitline connection circuit 502 may be configured to electrically connect and disconnect the ith bitline BL(i) from the sensing circuit 504 (and the latching circuit 506). In the case of a 3D NAND architecture, the ith bitline BL(i) may be connected to a respective memory hole from each NAND string of each NAND block of the 3D structure. In the case of a 2D NAND architecture, the ith bitline BL(i) may be connected to an associated NAND string. The ith bitline BL(i) may be one of a plurality bitlines and the NAND string may be one of a plurality of NAND strings included in a memory cell structure of a memory die. The NAND string can include one or more memory cells. For a read operation, a target memory cell can be a memory cell from which data is to be read, and thus, for which a sense operation is performed. For a verification operation, a target memory cell can be a memory cell being programmed in an associated program-verify operation.

When the bitline connection circuitry 502 connects the ith bitline BL(i) to the sensing circuit 504 (e.g. for a sense operation), current may flow from the sense circuit 504 to the ith bitline BL(i). Alternatively, when the bitline connection circuitry 502 disconnects the ith bitline BL(i) from the sense circuit 504, current may be prevented from flowing from the sensing circuit 504 to the ith bitline BL(i). Bitline connection circuit 502 may include a bitline biasing circuit configured to bias the ith bitline BL(i) by generating a bitline bias voltage at a bitline bias node. The amount of the bitline bias voltage may depend on whether the ith bitline BL(i) is a selected bitline or an unselected bitline. In particular, when the ith bitline BL(i) is a selected bitline, the bitline biasing may allow the bitline bias voltage at the high supply voltage level or a level corresponding to the high supply voltage, and when the ith bitline BL(i) is an unselected bitline, the bitline biasing circuit may generate the bitline bias voltage at the cell source voltage level or a level corresponding to the cell source voltage.

Sensing circuits 504 described herein can include a pre-charge circuit path configured to pre-charge one or more sense node(s) with a voltage at a pre-charge level during a sense operation. A latching circuit 506, in response to receiving a control signal at a high voltage level at a first transistor of the latch circuit 506, can enable a pre-charge circuit path to pre-charge the sense node with the voltage at the pre-charge level.

Figure 6:
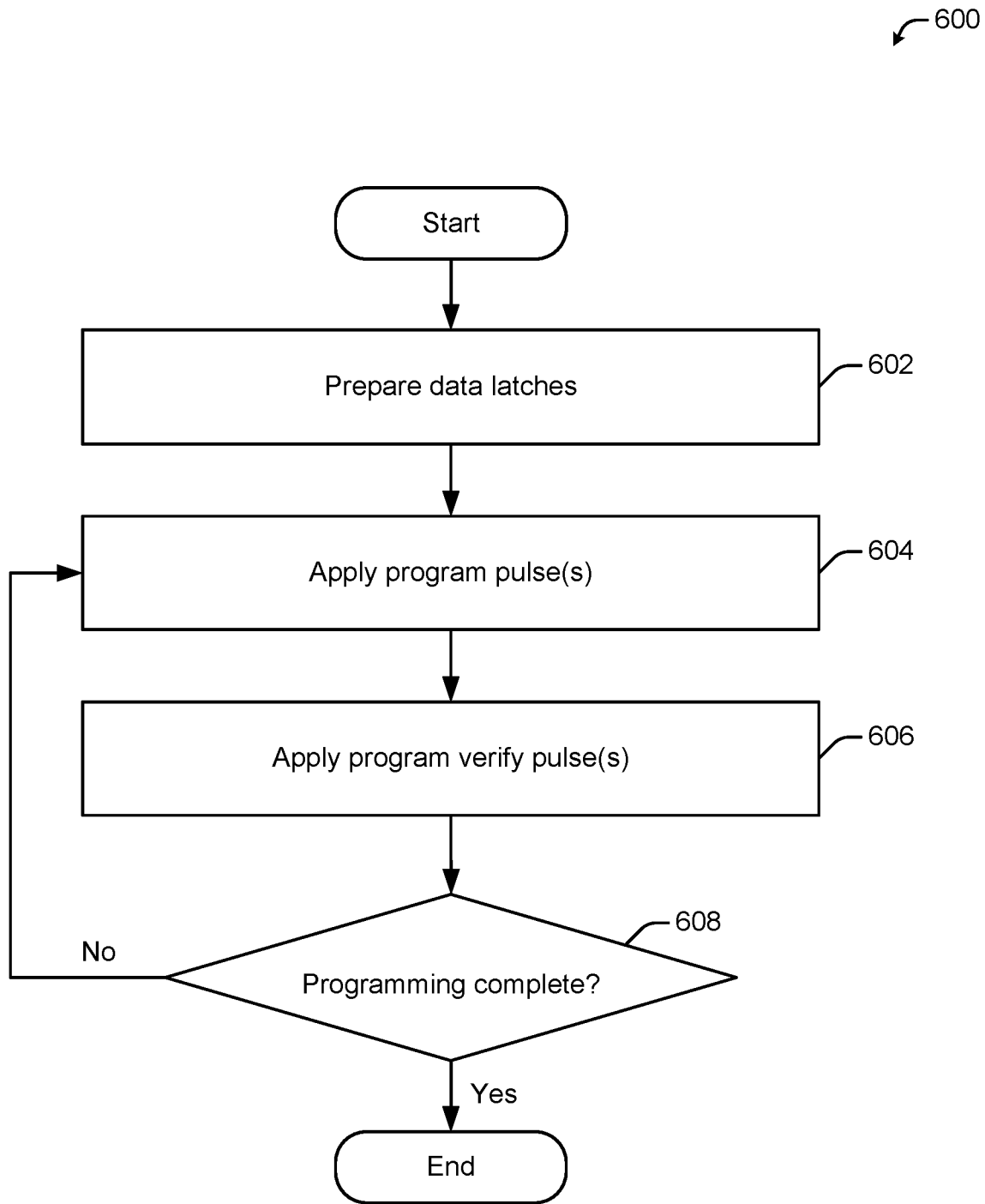
FIG. 6 is a flowchart of an illustrative programming method for a memory device.
Figures 7A, 7B:
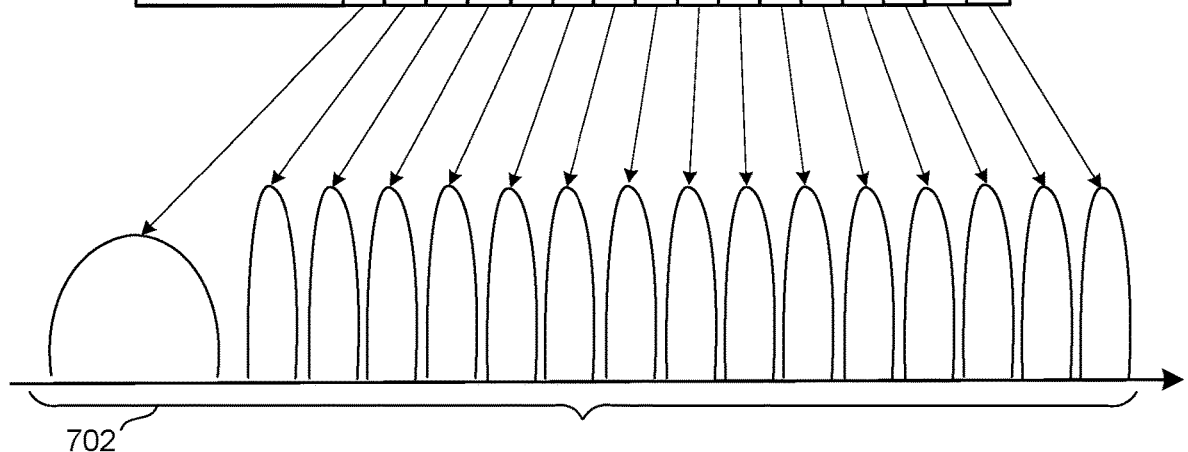
FIG. 7A depicts user program data stored in data latches prior to a preparation phase of the programming method of FIG. 6.
FIG. 7B depicts program data stored in the data latches after the preparation phase of the programming method of FIG. 6.

FIG. 6 is a flowchart of an illustrative programming method 600 for a memory device, such as a multi-bit NAND flash memory device. At block 602 of the method 600, data latches may be prepared. As previously noted, conventional programming techniques require a $\log_2$(# of cell states) number of data latches to store the program data to be programmed into the cells. For instance, as shown in FIG. 7A, which depicts user program data stored in data latches prior to the preparation operation at block 602, four data latches DL0-DL3 are provided for storing program data for programming a QLC (4-bit) memory cell array. In particular, DL0 is provided for storing lower page program data, DL1 is provided for storing middle page program data, DL2 is provided for storing upper page program data, and DL3 is provided for storing top page program data.

Referring again to FIG. 6, the preparation operation at block 602 may include translating program data into a binary encoded destination mapping that is better suited for the programming operation. For example, the prepared binary encoded destination mapping may provide better margins between adjacent threshold voltages corresponding to different cell states. FIG. 7C shows a table 700C that schematically illustrates the results of a preparation phase for a 3-bit cell (TLC). As shown, program data 704, including lower, middle, and upper page data, may be translated during the preparation phase to the binary encoded representation 706. The preparation operation at block 602 of the method 600 may be performed to translate each bit sequence of the program data to a corresponding bit sequence in the binary encoded representation 706 (which may be a different bit sequence), and which in turn, maps to a particular state of the TLC cell (i.e., the erase state or one of the programmed states). The program data may then be stored in the data latches based on the binary encoded representation 706.

After the preparation operation of block 602 of method 600 is performed, the binary encoded representation 700B shown in FIG. 7B may be obtained, for example. In particular, binary encoded representation 700B corresponds to a 4-bit QLC cell array. FIG. 7B illustrates a mapping between the binary encoded representation 700B and a set of threshold voltage distributions 702 representing the set of possible cell states. In particular, in the example of FIG. 7B, each 4-bit sequence that may be stored in the data latches DL0-DL3 is mapped, via the binary encoded representation 700B, to a corresponding threshold voltage distribution representing a particular state (erase and programmed) of a cell.

Referring again to FIG. 6, at block 604 of the method 600, a series of programming pukes may be applied to program a memory cell array based on the user program data. To program a flash memory cell, a high voltage may be applied to a wordline that includes the cell to be programmed. In particular, a programming voltage $V_{PGM}$ may be applied to the control gate of the transistor of the cell sought to be programmed, which causes electrons to move into the floating gate or CTL, thereby increasing the threshold voltage of the transistor of the cell. As previously described, the threshold voltage corresponds to a particular bit sequence that depends on the number of bits of information each cell is capable of storing. Programming a multi-bit flash memory cell may require multiple programming pulses depending on the accuracy of required threshold voltage (Vt) control and the range of distributed Vt after program operation. For higher accuracy, Vt may be increased with a $V_{PGM}$ sequence having a smaller step, because the amount of Vt shift of a memory cell may be proportional to the step of incrementing $V_{PGM}$. To provide a wider range in Vt distributions with the same accuracy, the number of program pulses to cover the range may need to be increased. For example, 3 bit/cell may require 4V Vt range and 4 bit/cell may require 5V to accommodate more Vt distributions. The range of Vt distributions is the 4V or 5V Vt in this example.

After the programming pulse(s) are applied to a cell, one or more program verify pulses may be applied at block 606 of the method 600. Then at block 608, a determination is made as to whether programming of the cell is complete. The determination at block 608 may be a determination as to whether the cell has passed the program-verify operation, that is, whether the cell has achieved a threshold voltage that maps to target bit information sought to be stored in the cell. In response to a negative determination at block 608, the method 600 returns to block 604, where one or more programming pulses may be applied. The method 600 may continue iteratively in this fashion until a positive determination is made at block 608.

The program-verify sequence of blocks 604-608 may be performed with respect to each cell that is programmed. For example, a program pulse at block 604 and verify pulse at block 606 are applied to all cells of a page because the memory cells in a page share a common wordline. Then the determination at block 608 is performed on each cell individually. Then on the next iteration of block 604, some cells may be programed at block 604, while others are not programmed. Whether a cell is programmed or not at block 604 is due to the voltage level of on the bitline associated with each cell. If bitline is at low level, the cell is programmed with a program pulse, but if the level is high, the cell is not programmed (e.g., program inhibit).

Figure 8:
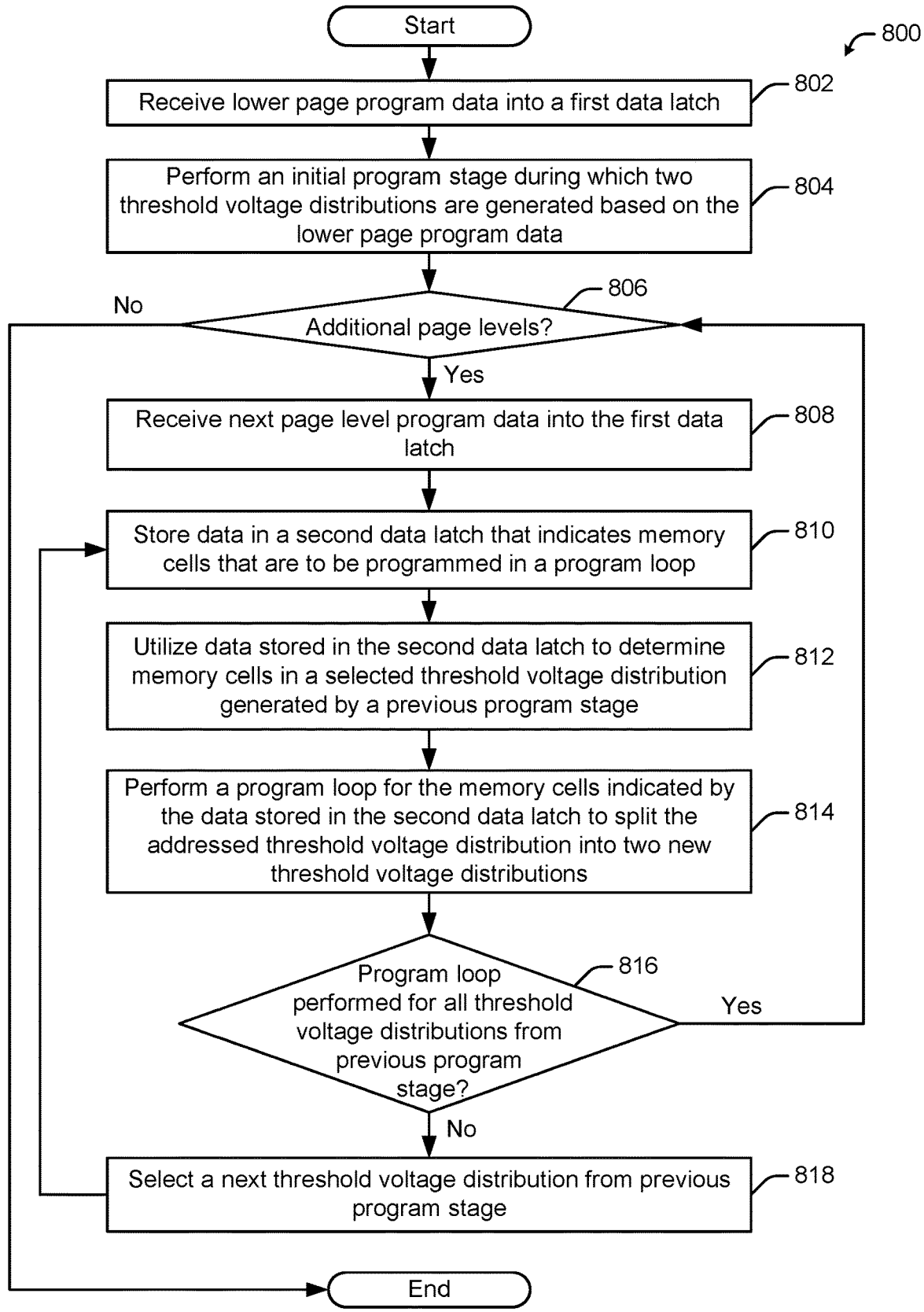
FIG. 8 is a flowchart of a multi-stage programming method for multi-bit-per-cell memory devices according to an example embodiment of the disclosed technology.

FIG. 8 is a flowchart of a multi-stage programming method 800 for multi-bit-per-cell memory devices according to an example embodiment of the disclosed technology. In example embodiments, the method 800 may be performed by a controller (e.g., controller 122 of FIG. 1), or more generally, any volatile or non-volatile memory system configured to interface with a NAND device (or that is embedded therein) including, without limitation, a separately provided dynamic random access memory (DRAM), an embedded microcontroller, or the like. In some embodiments, the instructions for performing the method 800 may be hardwired or fused into the memory core. In another example embodiment, one or more operation blocks of method 800 may be performed by a controller (e.g., controller 122 of FIG. 1), while other operation blocks are performed in a NAND device. For example, operation blocks 802 and 808 may be performed by a controller and the remaining operation blocks automatically or semi-automatically performed by the NAND device. Moreover, the method 800 may require only two data latches of the SADL peripheral circuitry provided with respect to each bitline to program an n-bit memory cell array. This represents a technical improvement over conventional programming techniques that require $\log_2$(# of possible states of n-bit memory cell) number of data latches to perform the programming operation.

Figure 9:
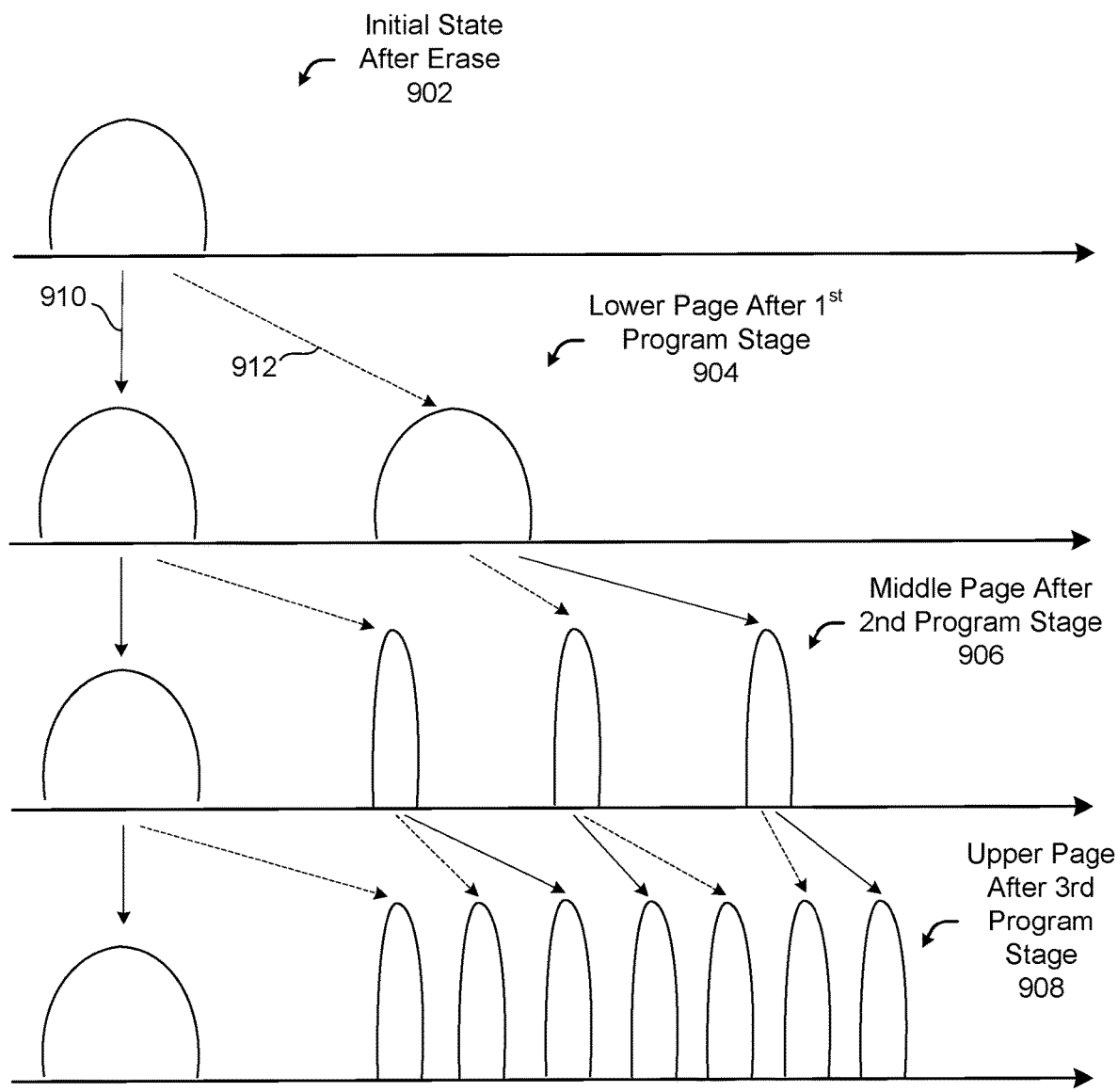
FIG. 9 is a schematic depiction of a multi-stage programming method for multi-bit-per-cell memory devices according to an example embodiment of the disclosed technology.

The method 800 may begin at block 802 with receipt of lower page program data into a first data latch (referred to as DL1 for the purposes of the description of method 800). The lower page program data may be program data entered by a user. In connection with receipt of the lower page program data, an initial program stage may be performed at block 804 of the method 800. During this initial program stage, two threshold voltage distributions may be generated based on the lower page program data. As depicted in FIG. 9, these two threshold voltage distributions may be generated from an initial threshold voltage distribution representing an initial erase state 902 of a cell array (or more specifically, of the page being programmed), and may include a first distribution 910 representing a lower page bit value of 1 (e.g., an erase state) and a second distribution 912 representing a lower page bit value of 0 (e.g., a programmed state). Throughout the Figures, a solid line extending from a prior stage threshold voltage distribution to a current program stage threshold voltage distribution may indicate a bit value of 1, while a dashed line may indicate a bit value of 0. In an example embodiment, generating these threshold voltage distributions includes performing a program operation on a memory cell to shift its threshold voltage to a value corresponding to the bit value of 1 (e.g., a value in the second threshold voltage distribution mentioned above) or maintaining a cell in the erase state (e.g., a threshold voltage value in the first threshold voltage distribution). Whether a cell is programmed or maintained in the erase state may depend on the lower page program data being received and latched at DL1.

At the conclusion of the initial program stage at block 804, the lower page 904 of the memory cells may include two threshold voltage distributions corresponding to the lower page data, as shown in FIG. 9. Then, at block 806 of the method 800, a determination may be made as to whether there are any additional page levels. That is, the determination at block 806 may be whether there is any additional program data corresponding to a next page level. As the technical benefits of the disclosed technology are fully realized in connection with programming of multi-bit memory cell arrays, it is assumed for the remaining description of the method 800 that a multi-bit cell array is being programmed and there are one or more additional levels of page data.

In response to a positive determination at block 806, program data corresponding to a next page level may be received into DL1. For instance, after the initial program stage is performed for the lower page program data, middle page program data may be received into DL1 at block 808 of the method 800. Then, at block 810 of the method 800, data may be stored in a second data latch (e.g., DL0), indicating which cells are in a threshold voltage distribution generated in a prior stage of the multi-stage programming method. More specifically, DL0 may store data in connection with an IDL, where a stored bit 0 indicates a cell to be programmed using the multi-stage method 800, and where a stored bit 1 indicates a cell that has passed program-verify and/or is not a target of the method 800.

At block 812 of the method 800, a next program stage may be initiated. In some embodiments, the operations at blocks 810-818 may be iteratively performed in connection with each program stage of the multi-stage programming method 800. This next program stage may include performing a program loop with respect to each threshold voltage distribution generated during the immediately prior program stage. Each program loop may split a particular threshold voltage distribution generated during the preceding program stage into two new threshold voltage distributions. Prior to initiating each program loop at block 814 of the method 800, an IDL may be performed at block 812 of the method 800 to utilize data stored in DL0 to distinguish the memory cells that are in the currently addressed threshold voltage distribution from those that are not. Each threshold voltage distribution generated during the prior program stage may be iterated through, and the above-described program loop may be performed for each such threshold voltage distribution.

As part of the second program stage for programming the middle page program data, each program loop performed at block 814 may include programming each cell that is within the addressed threshold voltage distribution from the previous program state corresponding to that program loop to an appropriate state (e.g., a threshold voltage) based on the middle page program data received and stored in DL1. FIG. 9 illustrates the middle page state 906 of the programmed cells after the second program stage is completed. In particular, four threshold voltage distributions have been generated at this point—two new distributions from the erase state threshold voltage distribution generated during the prior program stage (the initial program stage corresponding to the lower page program data) and two new distributions from the programmed state threshold voltage distribution generated from the lower page program data during the initial program stage.

After a program loop has been completed for a given addressed threshold voltage distribution, a determination may be made at block 816 as to whether a respective program loop has been performed for all threshold voltage distributions generated during the prior program stage. In response to a positive determination at block 816, the method 800 may return to block 806 where a determination is made as to whether there is additional program data corresponding to an additional page level. For instance, if the memory cell array includes 3-bit or greater cells, a positive determination is made at block 806, and a next program stage including the operations at blocks 808-818 may be performed.

On the other hand, if not all threshold voltage distributions generated during the prior program stage have been selected for a program loop, a negative determination is made at block 816, and a next threshold voltage distribution generated during the prior program stage is selected at block 818. The method 800 may then return to block 810, where data stored in DL0 is updated to reflect those cells that passed the program-verify operation of the previous program loop. In particular, bit values in DL0 may be set to 1 to indicate that those cells have been successfully programmed. Moreover, any cells that are not within the currently addressed threshold voltage distribution may have their corresponding bit values in DL0 set to 1 as well to indicate that they are not a target of the current program loop. The cells that are within the currently addressed threshold voltage distribution, however, may have corresponding bit values set to 0 in DL0 to indicate that the next program loop is to be performed with respect to these cells.

After all threshold voltage distributions generated from the initial program stage have been iterated through and a respective program loop has been performed with respect to each such distribution, the second program stage is complete. If the memory cell array is an MLC array in which each cell stores 2 bits of information, the multi-stage programming method 800 is complete. On the other hand, if each cell stores more than 2 bits of information, an additional program stage may be performed with respect to each additional bit of information that a cell can store. Using a TLC flash memory cell array as an example, after the second program stage corresponding to the middle page program data is completed and the data in DL0 has been updated to reflect the programming results of the program loops performed during the second program stage, upper page program data may be received and stored in DL1 at block 808. Then, a third program stage may be initiated during which a program loop is performed with respect to each of the four threshold voltage distributions generated during the second program stage. Each program loop results in one of the four threshold voltage distributions being split into two new threshold voltage distributions. Thus, the third program stage ultimately results in 8 threshold voltage distributions corresponding to the 8 possible states of a TLC flash cell. As shown in FIG. 9, the upper page 908 of the programmed cells after the third program stage includes the 8 threshold voltage distributions generated by splitting each of the 4 threshold voltage distributions generated during the prior second program stage.

The multi-stage programming method 800 may continue as described until no further page level data is received into DL0 (i.e., a negative determination at block 806). For instance, if the cell array is a QLC array, an additional program stage (i.e., a fourth program stage) may be performed for a total of 4 program stages. At the completion of the fourth program stage, the top page data programmed into the memory cell array would include 16 threshold voltage distributions, generated by splitting each of the 8 threshold voltage distributions from the third program stage. An additional program stage may be performed for each additional bit capable of being stored in a memory cell. For instance, for a 5-bit cell array, five program stages may be performed, resulting in 32 threshold voltage distributions. As previously noted, however, regardless of the number of bits capable of being stored in a cell, the method 800 can be implemented to program any n-bit cell array, where n is any integer value greater than or equal to 2, using only two data latches—one to store program data and the other to distinguish cells that are in the addressed threshold voltage distribution and which have not yet been successfully programmed from those that are not in the address threshold voltage distribution and/or which have been successfully programmed.

Figure 10:
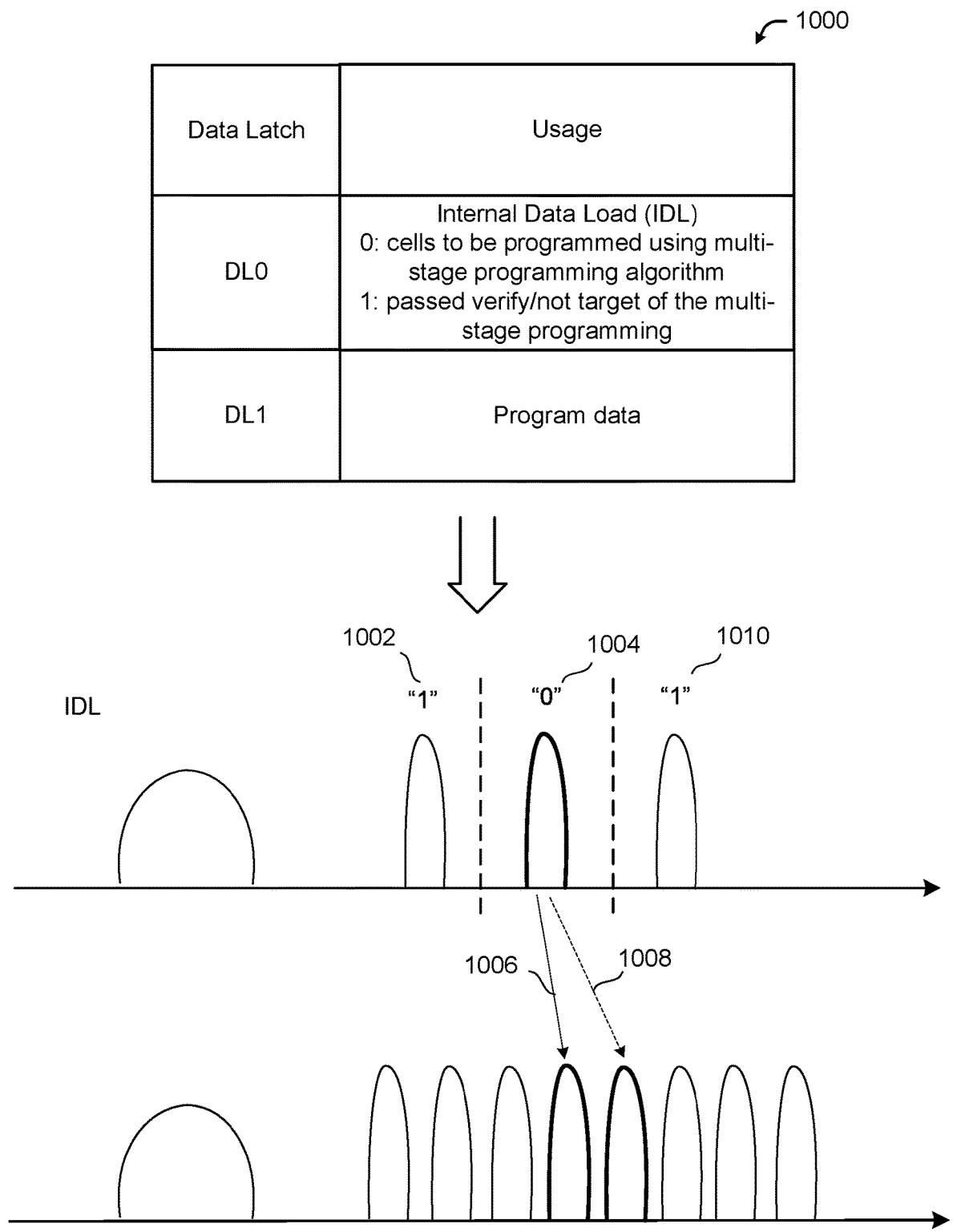
FIG. 10 illustrates data latch usage for a multi-stage programming method for multi-bit-per-cell memory devices according to an example embodiment of the disclosed technology.

FIG. 10 illustrates example data latch usage 1000 for the multi-stage programming method 800 of FIG. 8 according to an example embodiment of the disclosed technology. As shown, a first data latch (DL1) is used to store program data and a second data latch (DL0) is used to store IDL bit information. The program data stored in DL1 may correspond to a different page level for each program stage. For instance, during an initial program stage, lower page program data may be stored in DL1. During a second program stage, middle page program data may be stored in DL1, during a third program stage, upper page program data may be stored in DL1, and so forth. The bit information stored in DL0 may be updated at each program stage, or more specifically, upon completion of each program loop within a program stage to indicate which cells are within the currently addressed threshold voltage distribution of the current program loop and have not yet been successfully programmed, and to distinguish such cells from those that were successfully programmed during the current program loop or from those that are not within the addressed threshold voltage distribution corresponding to the current program loop.

As further illustrated in FIG. 10, the IDL performed based on the data in DL0 may provide a moving window that indicates, for each cell, whether it should be subjected to multi-stage programming or not. For example, the bit value of 1 corresponding to cells 1002 and 1010 indicate that the multi-stage programming should not be performed for these cells in the current program loop. This may be because the cell was successfully programmed during a prior program loop (e.g., a prior program loop of blocks 810-816 of FIG. 8 in the case of cell 1010) or is within a threshold voltage distribution corresponding to a future program loop that has not yet been performed (e.g., a future program loop of blocks 810-816 of FIG. 8 in the case of cell 1002). On the other hand, for a cell 1004 having a corresponding bit value of 0 stored in DL0, the multi-stage programming may be performed to program the cell 1004 to a threshold voltage corresponding to the program page data stored in DL1 for that cell 1004. The same may be performed for each cell that is within the currently addressed threshold voltage distribution (i.e., associated with the current program loop) to ultimately split the currently addressed threshold voltage distribution into two new distributions—a distribution 1006 corresponding to a bit value of 1 for the current page level and a distribution 1008 corresponding to a bit value of 0 for the current page level. It should be appreciated that the IDL assignment scheme may vary across embodiments (e.g., through a current programing loop of blocks 810-816). For example, in some alternative embodiments, a bit value of 0 in DL0 may be used to indicate a cell that has passed the program/verify sequence or is otherwise not a target of the multi-stage programming, while a bit value of 1 in DL0 may be used to indicate a cell that is to be programmed using the multi-state programming.

Figure 11:
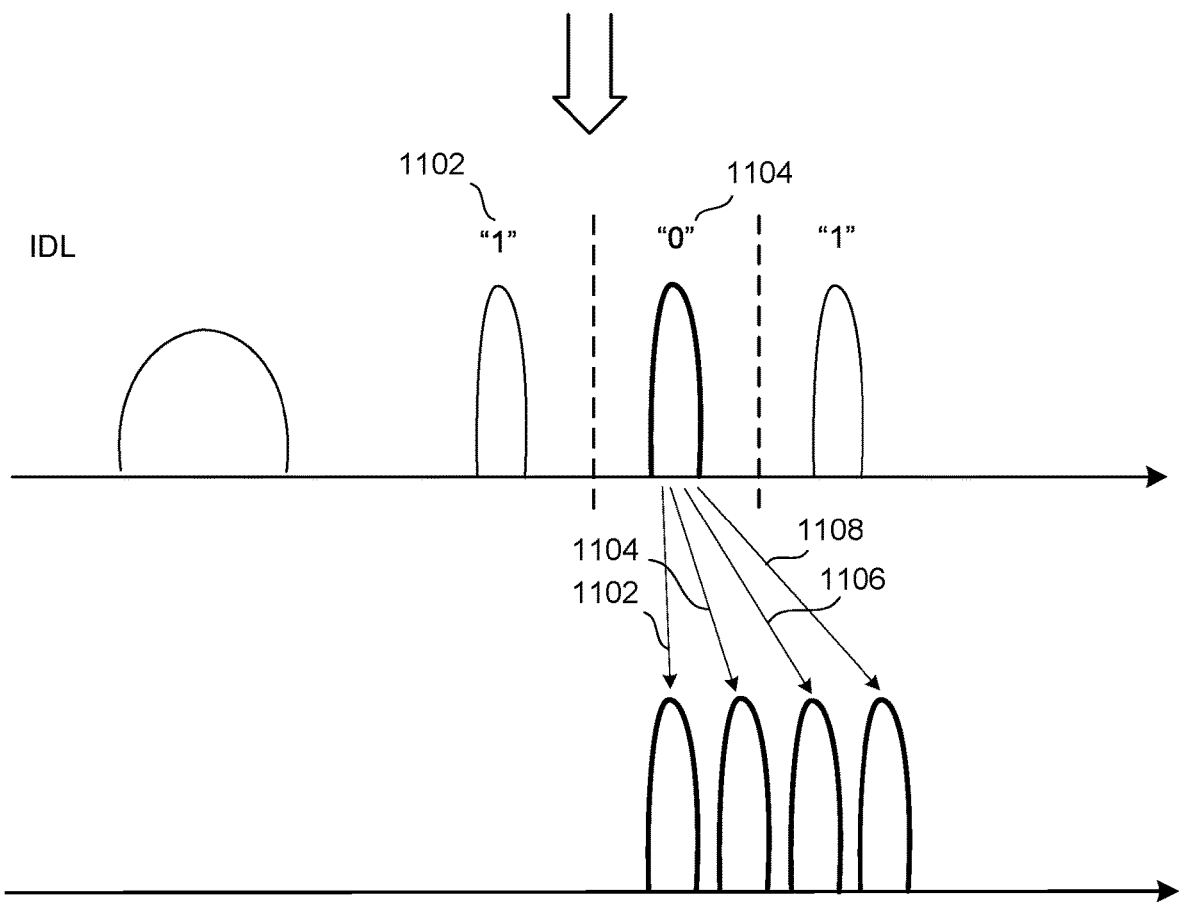
FIG. 11 illustrates a variation of the data latch usage for a multi-stage programming method for multi-bit-per-cell memory devices according to an example embodiment of the disclosed technology.

FIG. 11 illustrates a variation of data latch usage 1100 for a multi-stage programming method for multi-bit-per-cell memory devices according to an example embodiment of the disclosed technology. In the embodiment of FIG. 11, an additional data latch (DL2) is utilized to store program data. At any given program stage, DL1 may store program data at a particular page level, and DL2 may store program data at the next page level. For instance, during an initial program stage, DL1 may store the upper page program data, and DL2 may store the top page program data for QLC. The data latch DL0 may serve a similar function as in the embodiment of FIG. 10.

More generally, the data latch usage 1100 may enable programming two levels of program page data concurrently as part of the same program stage (e.g., middle and upper pages; upper and top pages; etc.), resulting in each threshold voltage distribution from a prior program stage being split into 4 threshold voltage distributions during a current program stage, and thereby reducing (e.g., cutting in half) the overall number of program stages that are needed. As with the data latch usage 1000 of FIG. 10, the IDL performed based on the data in DL0 may provide a moving window that indicates, for each cell, whether it should be subjected to multi-stage programming or not. For example, the bit value of 1 corresponding to cell 1102 indicates that the multi-stage programming should not be performed for this cell. In contrast, the bit value of 0 for cell 1104 indicates that the multi-stage programming should be performed for that cell 1104. All cells that are within the currently addressed threshold voltage distribution from a prior program stage may be programmed during a current program loop of a current program stage to ultimately split the currently addressed threshold voltage distribution into 4 new distributions—a distribution 1102 that may correspond to the bit sequence A, B=1, 1 (a bit value of 1 from the program page data in DL1 and a bit value of 1 from the program page data in DL2); a distribution 1104 that may correspond to the bit sequence A, B=1, 0; a distribution 1106 that may correspond to a bit sequence A, B=0, 0; and a distribution 1108 that may correspond to a bit sequence A, B=0, 1.

Figure 12:
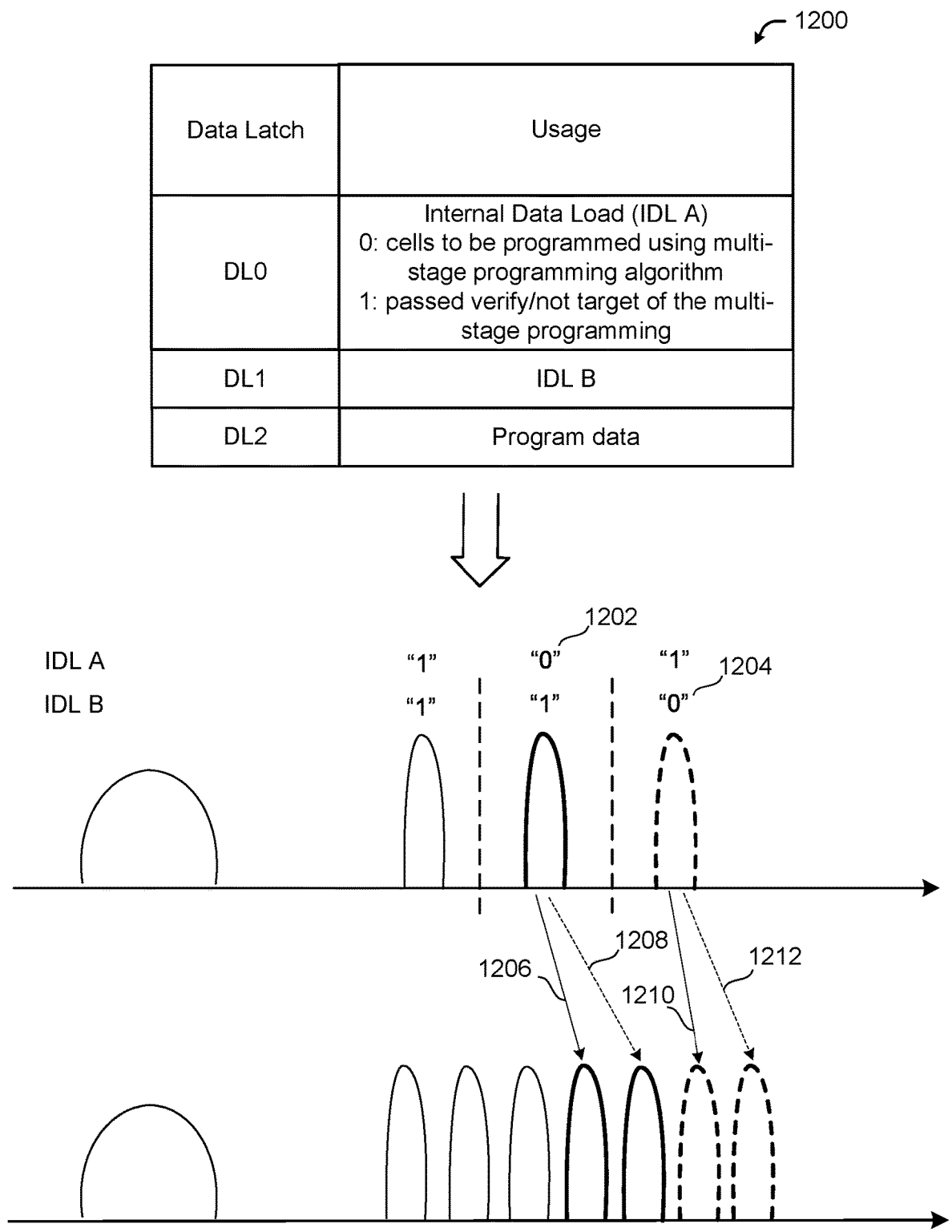
FIG. 12 illustrates another variation of the data latch usage for a multi-stage programming method for multi-bitper-cell memory devices according to an example embodiment of the disclosed technology.

FIG. 12 illustrates another variation of the data latch usage 1200 for a multi-stage programming method for multi-bit-per-cell memory devices according to an example embodiment of the disclosed technology. Similar to the data latch usage 1100, the data latch usage 1200 utilizes an additional data latch (for a total of three data latches), but instead of using the additional data latch to store program data corresponding to a different page, the data latch usage 1200 employs the additional data latch to perform an additional IDL function. For example, DL0 is an IDL A latch, DL1 is an IDL B latch, and DL2 is a program data latch. Using this scheme, two threshold voltage distributions generated during a prior program stage can be concurrently addressed, and thus, can be concurrently split into 2 new distributions each (for a total of four) during a current program stage.

In particular, as illustrated in FIG. 12, a cell 1202 having a corresponding bit value of 0 stored in DL0 for IDL A and a corresponding bit value of 1 stored in DL1 for IDL B may indicate that the cell 1202 is within one of the two currently addressed threshold voltage distributions. As such, each cell having this IDL A/B sequence may be programmed, resulting in the addressed threshold voltage distribution to which these cells correspond being split into two new distributions 1206 and 1208. Along similar lines, a cell 1204 having a corresponding bit value of 1 stored in DL0 for IDL A and a corresponding bit value of 0 stored in DL1 for IDL B may indicate that the cell 1204 is within the other of the two currently addressed threshold voltage distributions. As such, each cell having this IDL A/B sequence may be programmed, resulting in the addressed threshold voltage distribution to which these cells correspond being split into two new distributions 1210 and 1212. It should be appreciated that the IDL bit assignment scheme of FIG. 12 may vary in different embodiments. For example, the IDL A/B bit sequence of 0, 0 and/or 1, 1 may be used to indicate cells that are within one of the two currently addressed threshold voltage distributions. Moreover, in some embodiments, the IDL information held in data latches DL0 and DL1 may be switched, that is, DL0 may hold IDL B information and DL1 may hold IDL A information. More generally, the particular data latches used to store IDL information or program data may vary across any of the embodiments disclosed herein.

For instance, in the embodiment of FIG. 10, DL0 may be used to store the program data and DL1 may be used to store the IDL information. As another non-limiting example, in the data latch usage 1200, DL0 may be used to store program data, DL1 may be used to store IDL A information, and DL2 may be used to store IDL B information. It should be appreciated that numerous variations are within the scope of the disclosed technology.

Figure 13A:
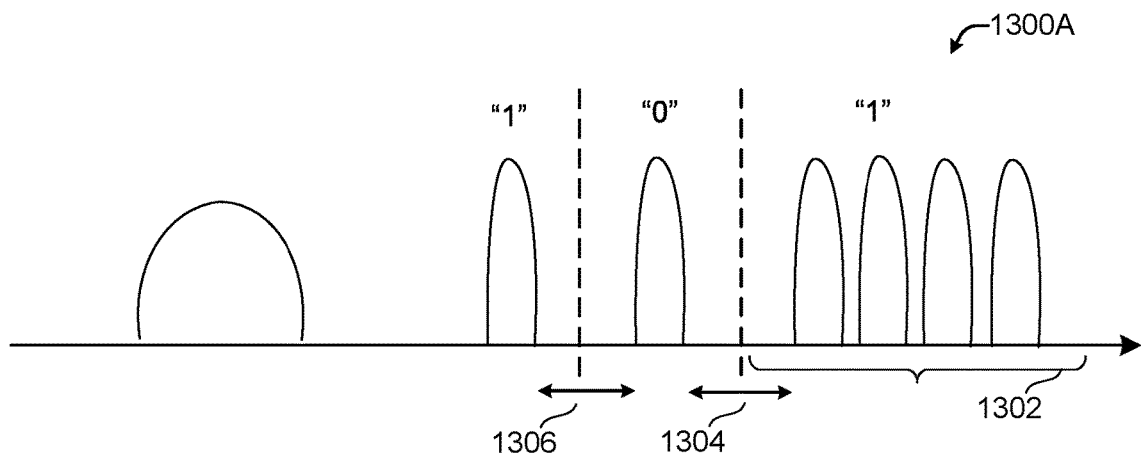
FIG. 13A illustrates a program loop direction for increasing read margins between newly generated threshold voltage distributions and previously generated threshold voltage distributions according to an example embodiment of the disclosed technology.

In some scenarios, beginning the series of program loops associated with a given program stage at a threshold voltage distribution corresponding to a lowest state may make it difficult to have sufficient read margin between newly generated threshold voltage distributions and the threshold voltage distributions generated during a prior program stage, which have a higher threshold voltage. FIG. 13A illustrates a program loop direction 1300A for increasing read margins between newly generated threshold voltage distributions and previously generated threshold voltage distributions. In particular, the embodiment of FIG. 13A addresses the above-described problem of insufficient read margin between newly generated threshold voltage distributions and previously generated threshold voltage distributions by beginning the program loops at the highest threshold voltage distribution.

As illustrated in FIG. 13A, the program loops begin at the highest threshold voltage distribution and proceed in the direction of lower threshold voltage distributions. In particular, FIG. 13A illustrates a set of higher threshold voltage distributions 1302 for which programming has been completed. The program loop direction of the embodiment of FIG. 13A results in wider read margins 1304, 1306 between threshold voltage distributions. In particular, the program loop direction of the embodiment of FIG. 13A results in a wider read margin 1304 between the newly generated threshold voltage distributions and the threshold voltage distributions generated during a prior program stage.

Figure 13B:
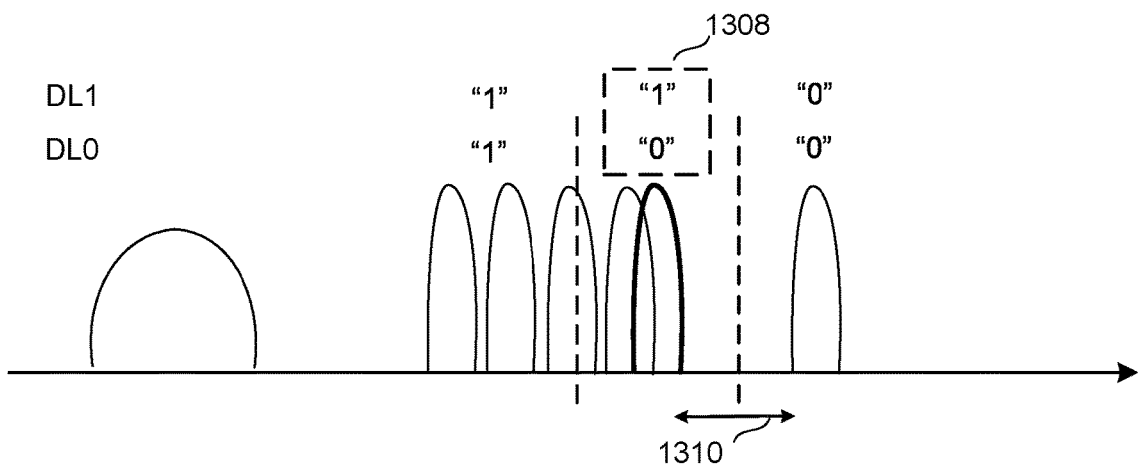
FIG. 13B illustrates another variation of the data latch usage for a multi-stage programming method for multi-bit-per-cell memory devices that ensure adequate read margins when programming from a lowest threshold voltage distribution according to an example embodiment of the disclosed technology.

In some scenarios, it may be desirable to start programming at the lowest cell state. For example, if charge pump ramp-up is slow, it may be desirable to begin programming at the lowest state, as this requires the lowest programming voltage to be applied. FIG. 13B illustrates another variation of the data latch usage 1300B for a multi-stage programming method for multi-bit-per-cell memory devices that ensures adequate read margins when programming from a lowest threshold voltage distribution according to an example embodiment of the disclosed technology. Similar to the data latch usage 1200 of the embodiment of FIG. 10, the data latch usage 1300B includes the use of two data latches to hold IDL information. However, in the data latch usage 1300B, the data latches DL0 and DL1 hold different types of IDL information than the data latches DL0 and DL1 hold in the data latch usage 1200.

In particular, in the data latch usage 1300B, one data latch (e.g., DL0) may be used to hold the lower limit of the addressed threshold voltage distribution generated during a prior program stage, and another data latch (e.g., DL1) may be used to hold the upper limit. After completing a program loop corresponding to a currently addressed threshold voltage distribution, the data latch holding the lower limit (e.g., DL0) may be overwritten with the IDL at the upper limit of the next addressed threshold distribution. Then, the other IDL data latch (e.g., DL1) may act as the lower limit for the next program loop corresponding to the next addressed threshold voltage distribution. In some embodiments, to exclude cells that have reached the target level from further programming, the data latch indicating the lower limit may be flipped. This does not produce any unwanted effect as that data latch will be overwritten upon completion of the current program loop. As illustrated in FIG. 13B, addressed cells may be the bit sequence 1308 corresponding to a bit value of 1 in DL1 and a bit value of 0 in DL0, for example. As previously described in connection with other embodiments, this bit assignment scheme may be vary across different embodiments. The data latch usage 1330B thus provides no or a small IDL margin on the lower side but an adequate margin 1310 on the higher side, as illustrated in FIG. 13B.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In an embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in an embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

What is claimed is:

1. A method of multi-stage programming of a multi-bit-per-cell memory array, the method comprising:
   receiving first program data corresponding to a first page level into a first data latch;
   performing an initial program stage of the multi-stage programming to generate a plurality of threshold voltage distributions from an initial threshold distribution based on the first program data corresponding to the first page level, wherein the initial threshold voltage distribution represents an initial erase state; and
   performing one or more additional program stages corresponding to one or more additional page levels, wherein performing each additional program stage comprises receiving additional programming data corresponding to a current additional page level into the first data latch and performing a program loop for each threshold voltage distribution generated during a prior program stage, the performing the program loop comprising splitting the threshold voltage distribution generated during the prior program stage into two new threshold voltage distributions based on data stored in a second data latch and the additional programming data.

2. The method of claim 1, wherein performing a particular program loop of a current additional program stage for an addressed prior threshold voltage distribution generated during the prior program stage comprises:
   determining, based on the data stored in the second data latch, a set of memory cells of the multi-bit-per-cell memory array that is in the addressed prior threshold voltage distribution; and
   programming the set of memory cells to shift their threshold voltages to states corresponding to program data currently stored in the first data latch.

3. The method of claim 2, wherein programming the set of memory cells causes the addressed prior threshold voltage distribution to be split into two new threshold voltage distributions associated with the current additional program stage.

4. The method of claim 3, wherein each of the two new threshold voltage distributions generated from the addressed prior threshold voltage distribution is shifted towards a higher threshold voltage than a particular prior threshold voltage distribution.

5. The method of claim 2, wherein determining, based on the data stored in the second data latch, the set of memory cells that is in the addressed prior threshold voltage distribution comprises determining that bit information stored in the second data latch for each memory cell in the set of memory cells comprises a first bit value indicating that the cell has a threshold voltage that falls within the addressed prior threshold voltage distribution.

6. The method of claim 5, wherein determining the set of memory cells further comprises excluding from the set of memory cells each memory cell associated with bit information in the second data latch comprising a second bit value different from the first bit value.

7. The method of claim 5, wherein performing the current additional program stage further comprises updating the data stored in the second data latch based on the memory cell programming performed during the particular program loop.

8. The method of claim 5, wherein updating the data stored in the second data latch comprises updating the bit information corresponding to the set of memory cells to flip each first bit value to a second bit value indicating at least one of: i) that a corresponding cell in the set of memory cells was successfully programmed or ii) that the corresponding cell is not within a next addressed prior threshold voltage distribution associated a next program loop of the current additional program stage.

9. The method of claim 2, wherein the data stored in the second data latch is internal data load (IDL) information.

10. The method of claim 1, wherein performing each additional program stage comprises generating a number of new threshold voltage distributions that is twice a number of threshold voltage distributions generated during the prior program stage.

11. A circuit, comprising:
   a first data latch configured to receive program data at a corresponding page level; and
   a second data latch configured to store bit information indicative of which memory cells of a multi-bit-per-cell memory array to program as part of a multi-stage programming process,
   wherein the multi-stage programming process comprises multiple program stages, and wherein, during a particular program stage, a series of program loops are performed, each program loop comprising identifying a set of memory cells in the multi-bit-per-cell memory array that are within a selected threshold voltage distribution generated during a prior program stage and programming the set of memory cells based on program data for a corresponding page level stored in the first data latch to divide the selected threshold voltage distribution into a plurality of new threshold voltage distributions.

12. The circuit of claim 11, wherein the multi-stage programming process is performed using only the first data latch and the second data latch among a plurality of data latches contained in the circuit.

* * * * *